(12) United States Patent
Matsuoka

(10) Patent No.: US 8,568,043 B2
(45) Date of Patent: Oct. 29, 2013

(54) COATING AND DEVELOPING APPARATUS AND COATING AND DEVELOPING METHOD

(75) Inventor: Nobuaki Matsuoka, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 587 days.

(21) Appl. No.: 12/896,957

(22) Filed: Oct. 4, 2010

(65) Prior Publication Data

US 2011/0086316 A1    Apr. 14, 2011

(30) Foreign Application Priority Data

Oct. 7, 2009   (JP) ................................. 2009-233583

(51) Int. Cl.
| | | |
|---|---|---|
| G03D 5/00 | (2006.01) | |
| G03F 7/00 | (2006.01) | |
| B05C 13/00 | (2006.01) | |
| B05C 11/00 | (2006.01) | |

(52) U.S. Cl.
USPC ............ 396/611; 430/325; 118/500; 118/600

(58) Field of Classification Search
USPC .................... 396/611; 430/325; 118/500, 600
See application file for complete search history.

(56) References Cited

U.S. PATENT DOCUMENTS

2008/0013946 A1 *   1/2008   Ono et al. ..................... 396/578

FOREIGN PATENT DOCUMENTS

| JP | 2003-007795 A | 1/2003 |
|---|---|---|
| JP | 2003-7795 A | 1/2003 |
| JP | 2003-289030 A | 10/2003 |
| JP | 2004-063490 A | 2/2004 |
| JP | 2007-317983 A | 12/2007 |
| JP | 2008-286881 A | 11/2008 |
| JP | 2009-016815 A | 1/2009 |
| JP | 2009-135137 A | 6/2009 |
| JP | 2009-135169 A | 6/2009 |
| JP | 2009-135542 A | 6/2009 |
| JP | 2009-194237 A | 8/2009 |
| JP | 2009-230106 A | 10/2009 |
| JP | 2010-267879 A | 11/2010 |
| JP | 2010-267880 A | 11/2010 |

OTHER PUBLICATIONS

An Office Action dated Dec. 13, 2011, issued from the Japanese Patent Office (JPO) of Japanese Patent Application No. 2009-233583 and a partial English translation thereof.

* cited by examiner

*Primary Examiner* — Rochelle-Ann J Blackman
(74) *Attorney, Agent, or Firm* — Abelman, Frayne & Schwab

(57) ABSTRACT

Disclosed is a coating and developing apparatus including (a) a first liquid process module to sequentially perform a first liquid process by a first chemical liquid, and a second liquid process by the first chemical liquid again; (b) a buffer module to sequentially store the respective substrates which have been subjected to the first liquid process and have not yet been subjected to the second liquid process; and (c) a second liquid process module to sequentially perform a third liquid process by a second chemical liquid. In particular, the third liquid process to be performed on a first substrate of the substrate group is started before the first liquid process performed on a last substrate of the substrate group is ended, in such a manner that right after the first liquid process is performed on the last substrate, the second liquid process is to be performed on the first substrate.

14 Claims, 25 Drawing Sheets

(d) M4

(e) M5

(f) M3

FIG.9A a case where flow A and flow B are performed at once

| MODULE | FOUP | M1 BOT | M2 COT | EXP | M4 DEV | BUF | M2 SR | M3 SC | M4 DEV | FOUP |
|---|---|---|---|---|---|---|---|---|---|---|
| number of processed wafers | | first process (flow A) | | | | | second process (flow B) | | | |
| 1 | 1 | | | | | | | | | |
| 2 | 2 | 1 | | | | | | | | |
| 3 | 3 | 2 | 1 | | | | | | | |
| 4 | 4 | 3 | 2 | 1 | | | | | | |
| 5 | 5 | 4 | 3 | 2 | 1 | | | | | |
| 6 | 6 | 5 | 4 | 3 | 2 | 1 | | | | |
| 7 | 7 | 6 | 5 | 4 | 3 | 2 | | | | |
| 8 | 8 | 7 | 6 | 5 | 4 | 3 | | | | |
| 9 | 9 | 8 | 7 | 6 | 5 | 4 | | | | |
| 10 | 10 | 9 | 8 | 7 | 6 | 5 | | | | |
| 11 | 11 | 10 | 9 | 8 | 7 | 6 | | | | |
| 12 | 12 | 11 | 10 | 9 | 8 | 7 | | | | |
| 13 | 13 | 12 | 11 | 10 | 9 | 8 | | | | |
| 14 | 14 | 13 | 12 | 11 | 10 | 9 | | | | |
| 15 | 15 | 14 | 13 | 12 | 11 | 10 | | | | |
| 16 | 16 | 15 | 14 | 13 | 12 | 11 | | | | |
| 17 | 17 | 16 | 15 | 14 | 13 | 12 | | | | |
| 18 | 18 | 17 | 16 | 15 | 14 | 13 | | | | |
| 19 | 19 | 18 | 17 | 16 | 15 | 14 | | | | |
| 20 | 20 | 19 | 18 | 17 | 16 | 15 | | | | |
| 21 | 21 | 20 | 19 | 18 | 17 | 16 | | | | |
| 22 | 22 | 21 | 20 | 19 | 18 | 17 | | | | |
| 23 | 23 | 22 | 21 | 20 | 19 | 18 | | | | |
| 24 | 24 | 23 | 22 | 21 | 20 | 19 | | | | |
| 25 | 25 | 24 | 23 | 22 | 21 | 20 | | | | |
| 26 | | 25 | 24 | 23 | 22 | 21 | | | | |
| 27 | | | 25 | 24 | 23 | 22 | | | | |
| 28 | | | | 25 | 24 | 23 | 1 | | | |
| 29 | | | | | 25 | 24 | 2 | 1 | | |
| 30 | | | | | | 25 | 3 | 2 | 1 | |

| | | | | | | | | | | |
|---|---|---|---|---|---|---|---|---|---|---|
| 31 | | | | | | | 4 | 3 | 2 | 1 |
| 32 | | | | | | | 5 | 4 | 3 | 2 |
| 33 | | | | | | | 6 | 5 | 4 | 3 |
| 34 | | | | | | | 7 | 6 | 5 | 4 |
| 35 | | | | | | | 8 | 7 | 6 | 5 |
| 36 | | | | | | | 9 | 8 | 7 | 6 |
| 37 | | | | | | | 10 | 9 | 8 | 7 |
| 38 | | | | | | | 11 | 10 | 9 | 8 |
| 39 | | | | | | | 12 | 11 | 10 | 9 |
| 40 | | | | | | | 13 | 12 | 11 | 10 |
| 41 | | | | | | | 14 | 13 | 12 | 11 |
| 42 | | | | | | | 15 | 14 | 13 | 12 |
| 43 | | | | | | | 16 | 15 | 14 | 13 |
| 44 | | | | | | | 17 | 16 | 15 | 14 |
| 45 | | | | | | | 18 | 17 | 16 | 15 |
| 46 | | | | | | | 19 | 18 | 17 | 16 |
| 47 | | | | | | | 20 | 19 | 18 | 17 |
| 48 | | | | | | | 21 | 20 | 19 | 18 |
| 49 | | | | | | | 22 | 21 | 20 | 19 |
| 50 | | | | | | | 23 | 22 | 21 | 20 |
| 51 | 26 | | | | | | 24 | 23 | 22 | 21 |
| 52 | 27 | 26 | | | | | 25 | 24 | 23 | 22 |
| 53 | 28 | 27 | 26 | | | | | 25 | 24 | 23 |
| 54 | 29 | 28 | 27 | 26 | | | | | 25 | 24 |
| 55 | 30 | 29 | 28 | 27 | 26 | | | | | 25 |
| 56 | 31 | 30 | 29 | 28 | 27 | 26 | | | | |
| 57 | 32 | 31 | 30 | 29 | 28 | 27 | | | | |
| 58 | 33 | 32 | 31 | 30 | 29 | 28 | | | | |
| 59 | 34 | 33 | 32 | 31 | 30 | 29 | | | | |
| 60 | 35 | 34 | 33 | 32 | 31 | 30 | | | | |
| 61 | 36 | 35 | 34 | 33 | 32 | 31 | | | | |
| 62 | 37 | 36 | 35 | 34 | 33 | 32 | | | | |
| 63 | 38 | 37 | 36 | 35 | 34 | 33 | | | | |
| 64 | 39 | 38 | 37 | 36 | 35 | 34 | | | | |
| 65 | 40 | 39 | 38 | 37 | 36 | 35 | | | | |
| 66 | 41 | 40 | 39 | 38 | 37 | 36 | | | | |
| 67 | 42 | 41 | 40 | 39 | 38 | 37 | | | | |
| 68 | 43 | 42 | 41 | 40 | 39 | 38 | | | | |
| 69 | 44 | 43 | 42 | 41 | 40 | 39 | | | | |
| 70 | 45 | 44 | 43 | 42 | 41 | 40 | | | | |
| 71 | 46 | 45 | 44 | 43 | 42 | 41 | | | | |
| 72 | 47 | 46 | 45 | 44 | 43 | 42 | | | | |
| 73 | 48 | 47 | 46 | 45 | 44 | 43 | | | | |
| 74 | 49 | 48 | 47 | 46 | 45 | 44 | | | | |
| 75 | 50 | 49 | 48 | 47 | 46 | 45 | | | | |
| 76 | | 50 | 49 | 48 | 47 | 46 | | | | |
| 77 | | | 50 | 49 | 48 | 47 | | | | |
| 78 | | | | 50 | 49 | 48 | 26 | | | |
| 79 | | | | | 50 | 49 | 27 | 26 | | |
| 80 | | | | | | 50 | 28 | 27 | 26 | |

| | | | | | | | | | |
|---|---|---|---|---|---|---|---|---|---|
| 81 | | | | | | 29 | 28 | 27 | 26 |
| 82 | | | | | | 30 | 29 | 28 | 27 |
| 83 | | | | | | 31 | 30 | 29 | 28 |
| 84 | | | | | | 32 | 31 | 30 | 29 |
| 85 | | | | | | 33 | 32 | 31 | 30 |
| 86 | | | | | | 34 | 33 | 32 | 31 |
| 87 | | | | | | 35 | 34 | 33 | 32 |
| 88 | | | | | | 36 | 35 | 34 | 33 |
| 89 | | | | | | 37 | 36 | 35 | 34 |
| 90 | | | | | | 38 | 37 | 36 | 35 |
| 91 | | | | | | 39 | 38 | 37 | 36 |
| 92 | | | | | | 40 | 39 | 38 | 37 |
| 93 | | | | | | 41 | 40 | 39 | 38 |
| 94 | | | | | | 42 | 41 | 40 | 39 |
| 95 | | | | | | 43 | 42 | 41 | 40 |
| 96 | | | | | | 44 | 43 | 42 | 41 |
| 97 | | | | | | 45 | 44 | 43 | 42 |
| 98 | | | | | | 46 | 45 | 44 | 43 |
| 99 | | | | | | 47 | 46 | 45 | 44 |
| 100 | | | | | | 48 | 47 | 46 | 45 |
| 101 | | | | | | 49 | 48 | 47 | 46 |
| 102 | | | | | | 50 | 49 | 48 | 47 |
| 103 | | | | | | | 50 | 49 | 48 |
| 104 | | | | | | | | 50 | 49 |
| 105 | | | | | | | | | 50 |
| 106 | | | | | | | | | |
| 107 | | | | | | | | | |
| 108 | | | | | | | | | |
| 109 | | | | | | | | | |
| 110 | | | | | | | | | |
| 111 | | | | | | | | | |
| 112 | | | | | | | | | |
| 113 | | | | | | | | | |
| 114 | | | | | | | | | |
| 115 | | | | | | | | | | a case where wafers are returned to FOUP
in each flow, and the flow is started again

| MODULE | FOUP | M1<br>BOT | M2<br>COT | EXP | M4<br>DEV | FOUP | M5<br>SR | M3<br>SC | M4<br>DEV | FOUP |
|---|---|---|---|---|---|---|---|---|---|---|
| number of processed wafers | | first process (flow A) | | | | | second process (flow B) | | | |
| 1 | 1 | | | | | | | | | |
| 2 | 2 | 1 | | | | | | | | |
| 3 | 3 | 2 | 1 | | | | | | | |
| 4 | 4 | 3 | 2 | 1 | | | | | | |
| 5 | 5 | 4 | 3 | 2 | 1 | | | | | |
| 6 | 6 | 5 | 4 | 3 | 2 | 1 | | | | |
| 7 | 7 | 6 | 5 | 4 | 3 | 2 | | | | |
| 8 | 8 | 7 | 6 | 5 | 4 | 3 | | | | |
| 9 | 9 | 8 | 7 | 6 | 5 | 4 | | | | |
| 10 | 10 | 9 | 8 | 7 | 6 | 5 | | | | |
| 11 | 11 | 10 | 9 | 8 | 7 | 6 | | | | |
| 12 | 12 | 11 | 10 | 9 | 8 | 7 | | | | |
| 13 | 13 | 12 | 11 | 10 | 9 | 8 | | | | |
| 14 | 14 | 13 | 12 | 11 | 10 | 9 | | | | |
| 15 | 15 | 14 | 13 | 12 | 11 | 10 | | | | |
| 16 | 16 | 15 | 14 | 13 | 12 | 11 | | | | |
| 17 | 17 | 16 | 15 | 14 | 13 | 12 | | | | |
| 18 | 18 | 17 | 16 | 15 | 14 | 13 | | | | |
| 19 | 19 | 18 | 17 | 16 | 15 | 14 | | | | |
| 20 | 20 | 19 | 18 | 17 | 16 | 15 | | | | |
| 21 | 21 | 20 | 19 | 18 | 17 | 16 | | | | |
| 22 | 22 | 21 | 20 | 19 | 18 | 17 | | | | |
| 23 | 23 | 22 | 21 | 20 | 19 | 18 | | | | |
| 24 | 24 | 23 | 22 | 21 | 20 | 19 | | | | |
| 25 | 25 | 24 | 23 | 22 | 21 | 20 | | | | |
| 26 | | 25 | 24 | 23 | 22 | 21 | | | | |
| 27 | | | 25 | 24 | 23 | 22 | | | | |
| 28 | | | | 25 | 24 | 23 | | | | |
| 29 | | | | | 25 | 24 | | | | |
| 30 | | | | | | 25 | | | | |

| | | | | | | | | | |
|---|---|---|---|---|---|---|---|---|---|
| 31 | | | | | | | 1 | | |
| 32 | | | | | | | 2 | 1 | |
| 33 | | | | | | | 3 | 2 | 1 |
| 34 | | | | | | | 4 | 3 | 2 | 1 |
| 35 | | | | | | | 5 | 4 | 3 | 2 |
| 36 | | | | | | | 6 | 5 | 4 | 3 |
| 37 | | | | | | | 7 | 6 | 5 | 4 |
| 38 | | | | | | | 8 | 7 | 6 | 5 |
| 39 | | | | | | | 9 | 8 | 7 | 6 |
| 40 | | | | | | | 10 | 9 | 8 | 7 |
| 41 | | | | | | | 11 | 10 | 9 | 8 |
| 42 | | | | | | | 12 | 11 | 10 | 9 |
| 43 | | | | | | | 13 | 12 | 11 | 10 |
| 44 | | | | | | | 14 | 13 | 12 | 11 |
| 45 | | | | | | | 15 | 14 | 13 | 12 |
| 46 | | | | | | | 16 | 15 | 14 | 13 |
| 47 | | | | | | | 17 | 16 | 15 | 14 |
| 48 | | | | | | | 18 | 17 | 16 | 15 |
| 49 | | for 1 lot (25 wafers), | | | | | 19 | 18 | 17 | 16 |
| 50 | | difference between two cases | | | | | 20 | 19 | 18 | 17 |
| 51 | | is 3 wafers | | | | | 21 | 20 | 19 | 18 |
| 52 | | | | | | | 22 | 21 | 20 | 19 |
| 53 | | | | | | | 23 | 22 | 21 | 20 |
| 54 | | | | | | | 24 | 23 | 22 | 21 |
| 55 | | | | | | | 25 | 24 | 23 | 22 |
| 56 | | | | | | | | 25 | 24 | 23 |
| 57 | | | | | | | | | 25 | 24 |
| 58 | 26 | | | | | | | | | 25 |
| 59 | 27 | 26 | | | | | | | | |
| 60 | 28 | 27 | 26 | | | | | | | |
| 61 | 29 | 28 | 27 | 26 | | | | | | |
| 62 | 30 | 29 | 28 | 27 | 26 | | | | | |
| 63 | 31 | 30 | 29 | 28 | 27 | 26 | | | | |
| 64 | 32 | 31 | 30 | 29 | 28 | 27 | | | | |
| 65 | 33 | 32 | 31 | 30 | 29 | 28 | | | | |
| 66 | 34 | 33 | 32 | 31 | 30 | 29 | | | | |
| 67 | 35 | 34 | 33 | 32 | 31 | 30 | | | | |
| 68 | 36 | 35 | 34 | 33 | 32 | 31 | | | | |
| 69 | 37 | 36 | 35 | 34 | 33 | 32 | | | | |
| 70 | 38 | 37 | 36 | 35 | 34 | 33 | | | | |
| 71 | 39 | 38 | 37 | 36 | 35 | 34 | | | | |
| 72 | 40 | 39 | 38 | 37 | 36 | 35 | | | | |
| 73 | 41 | 40 | 39 | 38 | 37 | 36 | | | | |
| 74 | 42 | 41 | 40 | 39 | 38 | 37 | | | | |
| 75 | 43 | 42 | 41 | 40 | 39 | 38 | | | | |
| 76 | 44 | 43 | 42 | 41 | 40 | 39 | | | | |
| 77 | 45 | 44 | 43 | 42 | 41 | 40 | | | | |
| 78 | 46 | 45 | 44 | 43 | 42 | 41 | | | | |
| 79 | 47 | 46 | 45 | 44 | 43 | 42 | | | | |
| 80 | 48 | 47 | 46 | 45 | 44 | 43 | | | | |

| | | | | | | | | | | |
|---|---|---|---|---|---|---|---|---|---|---|
| 81 | 49 | 48 | 47 | 46 | 45 | 44 | | | | |
| 82 | 50 | 49 | 48 | 47 | 46 | 45 | | | | |
| 83 | | 50 | 49 | 48 | 47 | 46 | | | | |
| 84 | | | 50 | 49 | 48 | 47 | | | | |
| 85 | | | | 50 | 49 | 48 | | | | |
| 86 | | | | | 50 | 49 | | | | |
| 87 | | | | | | 50 | | | | |
| 88 | | | | | | | 26 | | | |
| 89 | | | | | | | 27 | 26 | | |
| 90 | | | | | | | 28 | 27 | 26 | |
| 91 | | | | | | | 29 | 28 | 27 | 26 |
| 92 | | | | | | | 30 | 29 | 28 | 27 |
| 93 | | | | | | | 31 | 30 | 29 | 28 |
| 94 | | | | | | | 32 | 31 | 30 | 29 |
| 95 | | | | | | | 33 | 32 | 31 | 30 |
| 96 | | | | | | | 34 | 33 | 32 | 31 |
| 97 | | | | | | | 35 | 34 | 33 | 32 |
| 98 | | | | | | | 36 | 35 | 34 | 33 |
| 99 | | | | | | | 37 | 36 | 35 | 34 |
| 100 | | | | | | | 38 | 37 | 36 | 35 |
| 101 | | | | | | | 39 | 38 | 37 | 36 |
| 102 | | | | | | | 40 | 39 | 38 | 37 |
| 103 | | | | | | | 41 | 40 | 39 | 38 |
| 104 | | | | | | | 42 | 41 | 40 | 39 |
| 105 | | | | | | | 43 | 42 | 41 | 40 |
| 106 | | | | | | | 44 | 43 | 42 | 41 |
| 107 | | | | | | | 45 | 44 | 43 | 42 |
| 108 | | | | | | | 46 | 45 | 44 | 43 |
| 109 | | | | | | | 47 | 46 | 45 | 44 |
| 110 | | | | | | | 48 | 47 | 46 | 45 |
| 111 | | | | | | | 49 | 48 | 47 | 46 |
| 112 | | | | | | | 50 | 49 | 48 | 47 |
| 113 | | | | | | | | 50 | 49 | 48 |
| 114 | | | | | | | | | 50 | 49 |
| 115 | | | | | | | | | | 50 | for 2 lots (50 wafers), difference between two cases is 10 wafers (a)

(b)

(c)

(d)

EXP (e)

M4

(f)

M5

(g)

(h)

COATING AND DEVELOPING APPARATUS AND COATING AND DEVELOPING METHOD

This application is based on and claims priority from Japanese Patent Application No. 2009-233583, filed Oct. 7, 2009, with the Japanese Patent Office, the disclosure of which is incorporated herein in its entirety by reference.

TECHNICAL FIELD

The present disclosure relates to a coating and developing apparatus and a coating and developing method, which perform a liquid process on a substrate using a chemical liquid.

BACKGROUND

In a fabrication process of a semiconductor device, a photolithography process is used to form a fine resist pattern. In the photolithography process, the surface of a semiconductor substrate (hereinafter, referred to as a substrate, or a wafer) is subjected to a hydrophobizing process, and a bottom anti-reflective coating (BARC) is coated thereto, followed by a heating. And then, the substrate is coated with a resist and exposed through a thermal process, and the solubilized portion is removed through a developing process thereby forming the fine resist pattern.

As a semiconductor device is miniaturized, it has been difficult to sufficiently secure a fine-pattern exposure contrast with a line-width and space-width ratio of 1:1 by using only an optical exposure technology. Accordingly, there has been provided a method for forming a fine resist pattern, in which a resist pattern is formed on a substrate through a series of photolithography processes (including resist coating, thermal process, exposure, developing process), and slimming of the line width of the formed resist pattern (hereinafter, referred to as a slimming process) is carried out.

Herein, in the fine resist pattern forming method, including the slimming process, for example, as a first process of the first-half, several processes (such as a step of coating BARC on the wafer, a step of coating a resist on the BARC-coated wafer, a step of exposing a selected portion of the resist-coated wafer, and a first developing step of forming a resist pattern by supplying a developer to the exposed wafer and carrying out developing process) may be carried out.

Also, for example, as a second process of the latter-half, a second developing step of removing a middle exposed area from the developed resist pattern, a step of coating a reactive material for solubilizing the resist pattern, and a third developing step for carrying out the developing process of the wafer having the solubilized resist pattern through the supply of a developer may be carried out.

There is a coating and developing apparatus for forming such a fine resist pattern by performing a liquid process, including coating and developing processes, in which a plurality of wafers stored in a cassette (or a FOUP) are set in a cassette placing unit of a carrier block, while various processing units are disposed at both sides from the cassette side toward an exposure device side. See, for example, Japanese Patent Laid-open Publication No. 2003-7795.

SUMMARY

According to an embodiment, there is provided a coating and developing apparatus including a first liquid process module configured to sequentially perform a first liquid process by a first chemical liquid on each of substrates of a substrate group having a plurality of substrates, and to sequentially perform a second liquid process by the first chemical liquid again on each of the substrates which has been subjected to the first liquid process. The coating and developing apparatus further includes a buffer module to temporarily store each of the substrates sequentially which has been subjected to the first liquid process but has not yet been subjected to the second liquid process, and a second liquid process module to sequentially perform a third liquid process by a second chemical liquid on each of the substrates which has been taken out from a buffer module but has not yet been subjected to the second liquid process. In particular, the third liquid process to be performed on a first substrate of the substrate group is started before the first liquid process performed on a last substrate of the substrate group is ended so that the second liquid process is to be performed on the first substrate of the substrate group right after the first liquid process is performed on the last substrate of the substrate group. Furthermore, each of the substrates loaded to a carrier block by a carrier is sequentially transferred to a process module where a coating film including a resist film is formed, carried to an exposure device via an interface block, and then each of the substrates which has been exposed and returned via the interface block is developed in the process module, and then transferred to the carrier block thereby sequentially performing a liquid process on each of the substrates of the substrate group.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 9A to FIG. 9F are a time chart illustrating the processing state of wafers in each module during the performance of a coating and developing method according to a first exemplary embodiment, and a conventional coating and developing method.

DETAILED DESCRIPTION

Figure 1:
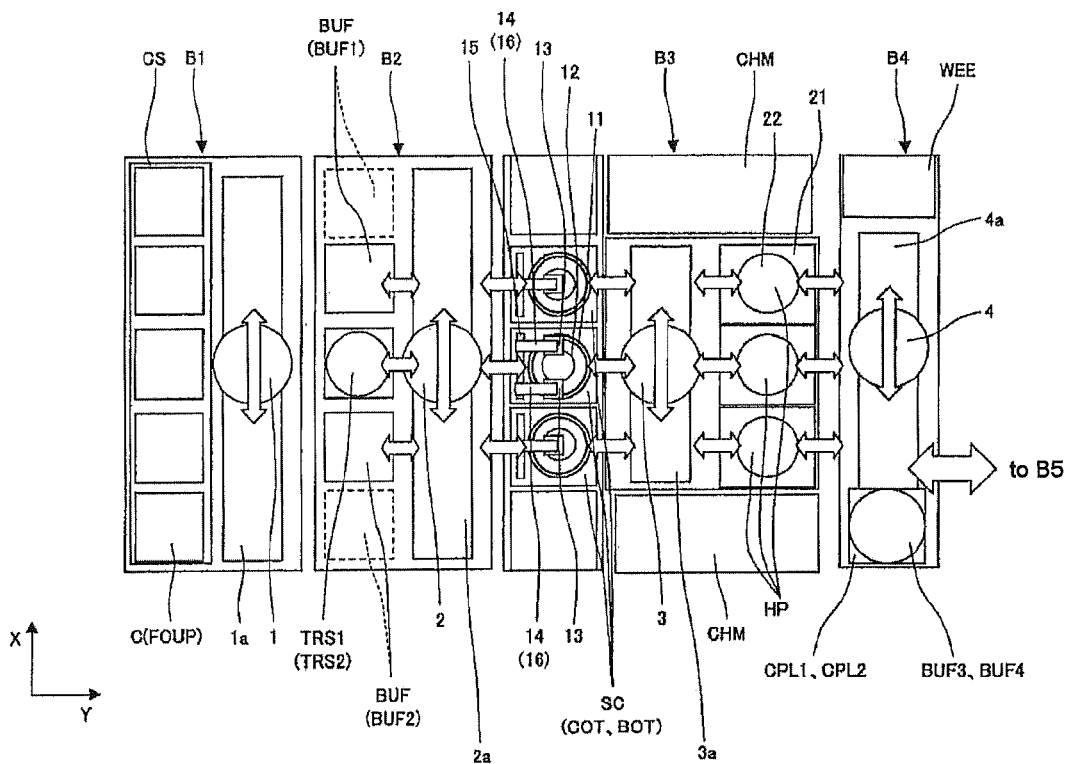
FIG. 1 is a schematic plan view illustrating the configuration of a coating and developing apparatus according to a first exemplary embodiment.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

When the coating and developing apparatus as described above is used to sequentially perform the fine resist pattern forming steps, including the slimming process, on each substrate of a substrate group including a plurality of substrates, there is a problem as described below.

In a case where a series of processes, including the slimming process, are performed, since the number of process steps is increased, the process steps may be divided into a first process of the first-half and a second process of the latter-half, as described above. For example, the first process is sequentially performed on the plurality of wafers stored in the FOUP as a flow A, and the wafers which have been subjected to the first process are stored in the FOUP again for the moment. And then, the second process is sequentially performed on the plurality of wafers, as a new separate flow B. However, the first process and the second process may use a common processing module mounted in the coating and developing apparatus. Specifically, for example, the first developing process of the first process, and the third developing process of the second process may be carried out in the same developing module.

As described above, in a case where the first process and the second process are carried out, respectively, as a flow A and a flow B, the second process is started again as the flow B after all processes of the first process of the flow A are ended, and all the wafers are returned to the FOUP. Accordingly, a total access time (TAT) is prolonged, thereby reducing the capability of performing the processes on the wafers.

Furthermore, the first process and the second process may use the same coating module in common.

The present disclosure has been made in consideration of these problems, and provides a coating and developing apparatus and a coating and developing method to sequentially perform liquid process on respective substrates of a substrate group including a plurality of substrates, in which when different process flows share a common liquid process module, the processing time can be shortened.

In order to solve the problem, the present disclosure is characterized in that it takes measures as described below.

According to an embodiment, there is provided a coating and developing apparatus including a first liquid process module configured to sequentially perform a first liquid process by a first chemical liquid on each of substrates of a substrate group having a plurality of substrates, and to sequentially perform a second liquid process by the first chemical liquid again on each of the substrates which has been subjected to the first liquid process. The coating and developing apparatus further includes a buffer module to temporarily store each of the substrates sequentially which has been subjected to the first liquid process but has not yet been subjected to the second liquid process, and a second liquid process module to sequentially perform a third liquid process by a second chemical liquid on each of the substrates which has been taken out from a buffer module but has not yet been subjected to the second liquid process. In particular, the third liquid process to be performed on a first substrate of the substrate group is started before the first liquid process performed on a last substrate of the substrate group is ended so that the second liquid process is to be performed on the first substrate of the substrate group right after the first liquid process is performed on the last substrate of the substrate group. Furthermore, each of the substrates loaded to a carrier block by a carrier is sequentially transferred to a process module where a coating film including a resist film is formed, carried to an exposure device via an interface block, and then each of the substrates which has been exposed and returned via the interface block is developed in the process module, and then transferred to the carrier block thereby sequentially performing a liquid process on each of the substrates of the substrate group.

In particular, the buffer module is designed in such a manner that each of the substrates is transferred by a single substrate carrying arm, between the buffer module and the first liquid process module. The coating and developing apparatus further comprises a third liquid process module to sequentially perform a fourth liquid process by a third chemical liquid on each of the substrates which has been subjected to the third liquid process but has not yet been subjected to the second liquid process. Moreover, the first liquid process module is a first developing module, the second liquid process module is a second developing module, the third liquid process module is a coating module, the first chemical liquid is a first developer, the second chemical liquid is a second developer which has a higher temperature or a higher concentration, than the first developer, and the third chemical liquid is acid to solubilize resist.

The coating and developing apparatus further comprises a third liquid process module to sequentially perform a fourth liquid process by a third chemical liquid on each of the substrates which has been subjected to the third liquid process but has not yet been subjected to the second liquid process. Also, the first liquid process module is a first developing module, the second liquid process module is a second developing module, the third liquid process module is a coating module, the first chemical liquid is a first developer, the second chemical liquid is a second developer which has a higher temperature or a higher concentration, than the first developer, and the third chemical liquid is acid to solubilize resist.

According to another embodiment of the present disclosure, there is provided a coating and developing apparatus including a first liquid process module configured to sequentially perform a first liquid process by a first chemical liquid on each of substrates of a substrate group having a plurality of substrates, and to sequentially perform a second liquid process by a second chemical liquid again on each of the substrates which has been subjected to the first liquid process. The coating and developing apparatus further includes a second liquid process module to sequentially perform a third liquid process by a third chemical liquid on each of the substrates which has been subjected to the first liquid process, and a buffer module to temporarily store each of the substrates sequentially which has been subjected to the third liquid process but has not yet been subjected to the second liquid process, until the first liquid process performed on a last substrate of the substrate group is ended. In particular, each of the substrates loaded to a carrier block by a carrier is sequentially transferred to a process module where a coating film including a resist film is formed, carried to an exposure device via an interface block, and then each of the substrates which has been exposed and returned via the interface block is developed in the process module, and then transferred to the carrier block thereby sequentially performing a liquid process on each of the substrates of the substrate group.

According to a further embodiment of the present disclosure, there is provided a coating and developing method comprising: performing a first liquid process by a first liquid process module on a substrate of a substrate group having a plurality of substrates using a first chemical liquid; temporarily storing the substrate which has been subjected to the first liquid process in a buffer module; performing a second liquid process by a second liquid process module on the substrate taken out from the buffer module after the storing step using a second chemical liquid; and performing a third liquid process by the first liquid process module again on the substrate which has been subjected to the second liquid process using the first chemical liquid, wherein the second liquid process to be performed on a first substrate of the substrate group is started before the first liquid process performed on a last substrate of the substrate group is ended so that the third liquid process is to be performed on the first substrate of the substrate group right after the first liquid process is performed on the last substrate of the substrate group, and wherein each of the substrates loaded to a carrier block by a carrier is sequentially transferred to a process module where a coating film including a resist film is formed, carried to an exposure device via an interface block, and then each of the substrates which has been exposed and returned via the interface block is developed in the process module, and then transferred to the carrier block thereby sequentially performing a liquid process on each of the substrates of the substrate group.

In particular, the buffer module allows the substrate to be transferred by a single substrate carrying arm, between the buffer module and the first liquid process module. Moreover, the coating and developing method further performs a fourth liquid process by a third liquid process module on the substrate which has been subjected to the second liquid process but has not yet been subjected to the third liquid process using a third chemical liquid. Furthermore, the first liquid process module is a first developing module, the second liquid process module is a second developing module, the third liquid process module is a coating module, the first chemical liquid is a first developer, the second chemical liquid is a second developer which has a higher temperature or a higher concentration, than the first developer, and the third chemical liquid is acid to solubilize resist.

The coating and developing method further performs a fourth liquid process by a third liquid process module on the substrate which has been subjected to the second liquid process but has not yet been subjected to the third liquid process using a third chemical liquid. Moreover, the first liquid process module is a first developing module, the second liquid process module is a second developing module, the third liquid process module is a coating module, the first chemical liquid is a first developer, the second chemical liquid is a second developer which has a higher temperature or a higher concentration, than the first developer, and the third chemical liquid is acid to solubilize resist.

According to a still further embodiment of the present disclosure, there is provided a coating and developing method comprising: performing a first liquid process by a first liquid process module on a substrate of the substrate group using a first chemical liquid; performing a second liquid process by a second liquid process module on the substrate which has been subjected to the first liquid process using a second chemical liquid; temporarily storing the substrate which has been subjected to the second liquid process in a buffer module, until the first liquid process performed on a last substrate of the substrate group is ended; and performing a third liquid process by the first liquid process module again on the substrate taken out from the buffer module using a third chemical liquid wherein each of the substrates loaded to a carrier block by a carrier is sequentially transferred to a process module where a coating film including a resist film is formed, carried to an exposure device via an interface block, and then each of the substrates which has been exposed and returned via the interface block is developed in the process module, and then transferred to the carrier block thereby sequentially performing a liquid process on each of the substrates of the substrate group.

According to the present disclosure, respective substrates of a substrate group including a plurality of substrates are sequentially subjected to liquid process, in which when different process flows share a common liquid process module, the processing time can be shortened.

Hereinafter, exemplary embodiments of the present disclosure will be described with reference to the drawings.

First Embodiment

First, a coating and developing apparatus and a coating and developing method, according to a first exemplary embodiment, will be described with reference to FIGS. 1 to 9.

Figure 2:
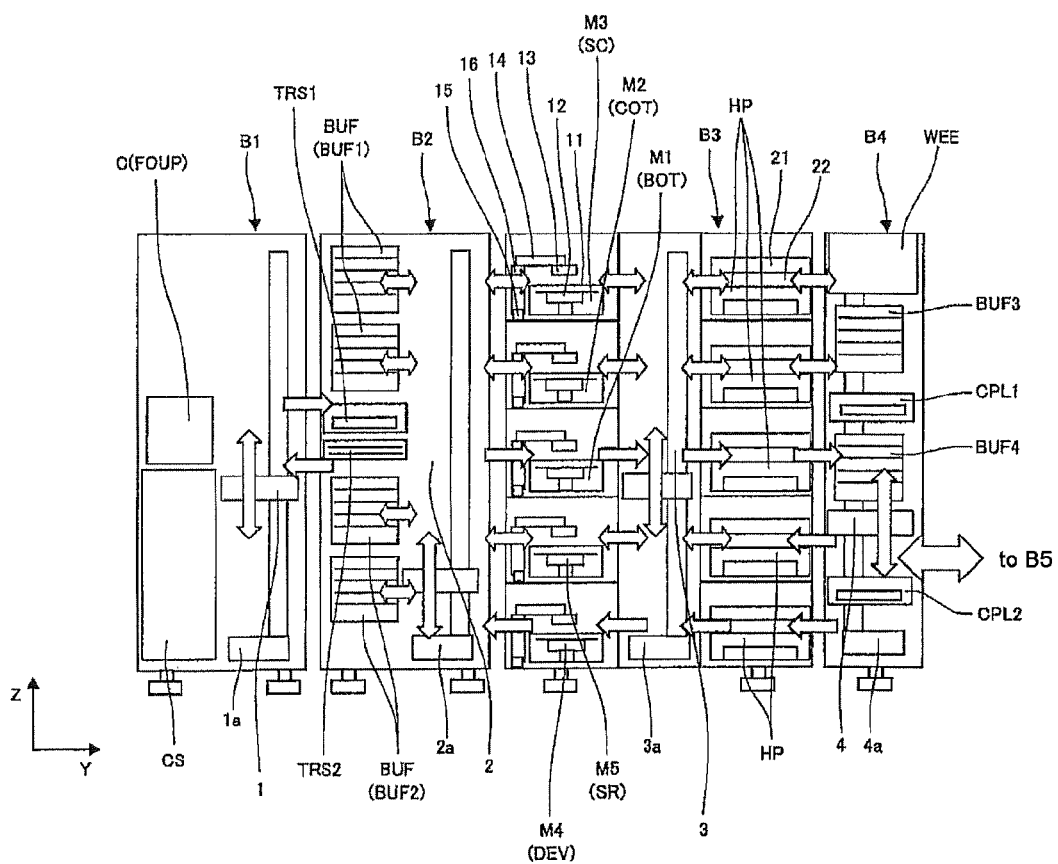
FIG. 2 is a schematic plan view illustrating the configuration of a coating and developing apparatus according to a first exemplary embodiment.

FIG. 1 and FIG. 2 show a schematic plan view and a schematic front view which respectively illustrate the configuration of the coating and developing apparatus according to the present embodiment.

The coating and developing apparatus according to the present embodiment has a carrier block B1, a buffer block B2, a coating/developing block B3, and an interface block B4. The blocks are disposed in a row in the order described above, from carrier block B1 to interface block B4, and interface block B4 is connected to an exposure device B5 (not shown).

Carrier block B1 has a cassette placing unit CS, and a wafer carrying arm 1. A predetermined position on the upper surface of cassette placing unit CS is designed to allow a plurality of cassettes C (hereinafter, referred to as FOUPs) to be disposed in a row in a horizontal X direction.

Wafer carrying arm 1 is provided in such a manner that it can move in the X direction on a carrying route 1a. Wafer carrying arm 1 is configured to move in a wafer arrangement direction (Z direction; vertical direction) of wafers W received in the FOUPs, and to selectively access wafers W in each of the X-directionally disposed FOUPs. Wafer carrying arm 1 is configured to access a buffer module of buffer block B2 as described below.

Buffer block B2 has transfer units TRS1 and TRS2, buffer modules BUF and a wafer carrying arm 2. Buffer modules BUF are disposed in a row in the X direction within a plane, and are overlappingly disposed on top of each other in the Z direction.

Two transfer units TRS1 and TRS2 are overlappingly provided on top of each other, and transfer wafers W to and from wafer carrying arm 1 of carrier block B1.

Buffer module BUF, for example, includes buffer modules BUF1 and BUF2 which are overlappingly disposed at the top and the bottom. Buffer module BUF1 at the top stores, for the moment, wafer W transferred from carrier block B1 to any one of coating modules BOT, COT, and SC of coating/developing block B3, or stores wafer W which is returned from any one of coating modules BOT, COT, and SC for the moment and then is to be transferred to any one of coating modules BOT, COT, and SC. Also, buffer module BUF2 at the bottom stores, for the moment, wafer W which is returned from any one of respective developing modules DEV and SR of coating/developing block B3 for the moment, and then is to be transferred to any one of developing modules DEV and SR or any one of coating modules BOT, COT, and SC.

Wafer carrying arm 2 is provided in such a manner that it can move in the X direction on a carrying route 2a. Wafer carrying arm 2 is configured to also move in a wafer arrangement direction (Z direction; vertical direction) of wafers W received in transfer units TRS1 and TRS2, and to selectively access wafers W within transfer units TRS1 and TRS2 overlappingly provided on top of each other. Wafer carrying arm 2 transfers wafers W between transfer units TRS1 and TRS2, buffer modules BUF1 and BUF2, and coating modules BOT, COT, and SC, and developing modules DEV, and SR of coating/developing block B3.

Also, between carrier block B1 and buffer block B2, an inspection block B1' for inspecting wafers W may be provided. Also, between buffer block B2 and coating/developing block B3, or in a part of coating/developing block B3, a hydrophobization/thermal-process block B2' for performing hydrophobization or thermal process on wafers W may be provided.

Coating/developing block B3 has coating modules BOT, COT, and SC, developing modules DEV and SR, a wafer carrying arm 3, and a heating module HP.

Coating module BOT is a BARC coating module which coats a wafer with BARC. Coating module COT is a resist coating module which coats a wafer with a resist. Coating module SC is a slimming coating module which coats acid for solubilizing the resist. Developing module DEV is a first developing module which performs developing process on a wafer by using a first developer. Developing module SR is a second developing module which performs developing process (slimming rinse) on a wafer by using a second developer in order to perform slimming process on the wafer, and is called a slimming rinse process module.

The coating modules and the developing modules are overlappingly disposed in upper/lower two stages. The coating modules at the upper portion, for example, overlappingly disposed in upper/lower three stages. In the present embodiment, for example, the coating modules are overlappingly disposed in the order of BARC coating module BOT, resist coating module COT, and slimming coating module SC, from bottom to top. The developing modules at the lower portion, for example, overlappingly disposed in upper/lower two stages. In the present embodiment, for example, the developing modules are overlappingly disposed in the order of first developing module DEV, and second developing module SR, from bottom to top. As a result, first developing module DEV, second developing module SR, BARC coating module BOT, resist coating module COT, and slimming coating module SC are overlappingly disposed in the order from the bottom to top.

Herein, BARC coating module BOT, resist coating module COT, slimming coating module SC, first developing module DEV, and second developing module SR are referred to as modules M1 to M5, respectively.

Also, module M4 (first developing module DEV) corresponds to a first developing module and a first liquid process module, in the present disclosure. Also, module M5 (second developing module SR) corresponds to a second developing module and a second liquid process module, in the present disclosure. Also, module M3 (slimming coating module SC) corresponds to a coating module and a third liquid process module, in the present disclosure. Also, the first developer used in module M4 (first developing module DEV) corresponds to a first chemical liquid in the present disclosure. Also, the second developer used in module M5 (second developing module SR) corresponds to a second chemical liquid in the present disclosure. Also, the acid for solubilizing the resist, used in module M3 (slimming coating module SC), corresponds to a third chemical liquid in the present disclosure.

Also, modules M1 to M5 need only directly transfer wafers between buffer modules BUF1 and BUF2, and modules M1 to M5, by wafer carrying arm 2 (one substrate carrying arm). Accordingly, the present disclosure is not limited to the case where modules M1 to M5 are overlappingly disposed on top of each other, and may employ various dispositions such as side-by-side disposition within a horizontal plane. For example, as shown in FIG. 1, modules may be disposed in a row in the X direction within a horizontal plane.

Hereinafter, each of coating modules and developing modules which are modules M1 to M5 will be described. Modules M1 to M5 have an approximately same configuration except that they use different chemical liquids. Thus, herein, the configuration of module M3 (slimming coating module SC) will be representatively described.

Module M3 (slimming coating module SC) has a cup 11, a spin chuck 12, and a nozzle 13.

Cup 11 is disposed in the center of module M3 (slimming coating module SC), and has a ring shape. Spin chuck 12 is disposed within cup 11, and is rotatably driven by a rotation driving means including, for example, a motor (not shown), in a state that it fixedly holds wafer W by vacuum suction. Spin chuck 12 may be vertically driven by an up/down driving means including, for example, an air cylinder (not shown), and transfer wafer W to/from wafer carrying arm 2.

Nozzle 13 supplies a chemical liquid to the surface of wafer W. Nozzle 13 is connected to a chemical liquid supply source (not shown) via a chemical liquid supply tube (not shown), and is supplied with a chemical liquid from the chemical liquid supply source. Nozzle 13 is detachably attached to the front end of a nozzle scan arm 14. Nozzle scan arm 14 is attached to the upper portion of a vertical supporting member 16 which can horizontally move in the X direction along a guide rail 15 provided in one direction (X direction) on a bottom plate of module M3 (slimming coating module SC). Also, nozzle scan arm 14 is configured to move together with nozzle 13 in the Y direction by a Y-direction driving mechanism (not shown).

Also, in each of modules M1 to M5, a group including nozzle 13, nozzle scan arm 14, and vertical supporting member 16 is provided correspondingly to the kinds of used chemical liquids, such as, resist, BARC, TARC (Top Anti-Reflective Coating), SC (Immersion Top Coat), SOG (Spin On Glass), or the like. In the example shown in FIG. 2, a group including nozzle 13, nozzle scan arm 14, and vertical supporting member 16 is provided correspondingly to BARC in module M1 (BARC coating module BOT), correspondingly to the resist in module M2 (resist coating module COT), correspondingly to the first developer in module M4 (first developing module DEV), and correspondingly to the second developer in module M5 (second developing module SR).

Also, when a module uses plural kinds of chemical liquids, a plurality of nozzles 13 may be provided correspondingly to respective kinds of chemical liquids. FIG. 1 shows an example, in which two groups, each of which includes nozzle 13, nozzle scan arm 14, and vertical supporting member 16, are provided.

Heating module HP is disposed in such a manner that a plurality of heating modules HP are overlapped on top of each other. Heating module HP has a heating chamber 21, and a heating plate 22. Heating chamber 21, as shown in FIG. 2, has heating plate 22 received within heating chamber 21. Heating plate 22, as shown in FIG. 1 and FIG. 2, has, for example, a disc shape with a thickness, and a heater (not shown) is embedded within heating plate 22, for example. The heater may increase the temperature of heating plate 22 up to a predetermined heating temperature, for example, up to 130° C. Around the center of heating plate 22, an elevatable supporting pin (not shown) is provided, and wafer W may be transferred between heating plate 22 and wafer carrying arm 3 (or a wafer carrying arm 4 as mentioned below) by the supporting pin.

Wafer carrying arm 3 is provided between modules M1 to M5, and heating module HP. Wafer carrying arm 3 is movably provided in the X-direction on a carrying route 3a. Wafer carrying arm 3 is configured to move in the arrangement direction (Z direction; vertical direction) of modules M1 to M5 and heating modules HP, and to selectively access modules M1 to M5 and heating modules HP. Thus, wafer carrying arm 3 is provided in such a manner that it can transfer wafer W between modules M1 to M5, and heating modules HP, as described below.

In coating/developing block B3, in an empty space at the front side and inner side in the X direction, or at the upper side and lower side in the Z direction, from the perspective of the plane, a chemical chamber CHM for supplying various kinds of chemical liquids to respective coating units of coating/developing block B3 may be provided. Also, instead of chemical chamber CHM, a machine room receiving, for example, an electric control circuit may be provided.

Also, in between coating/developing block B3 and interface block B4, a rinse cleaning block B3' provided with a spin cleaning unit SRS for cleaning wafer W, an immersion cleaning unit PIR, a scrubber SCR, or a back scrubber BST, may be provided.

Interface block B4 has cooling modules CPL1 and CPL2, buffer modules BUF3 and BUF4, a peripheral exposure device WEE, and a wafer carrying arm 4.

Cooling modules CPL1 and CPL2, and buffer modules BUF3 and BUF4 are overlappingly disposed on top of each other. Cooling modules CPL1 and CPL2 perform a cooling process for wafer W which has been subjected to a thermal process in each of heating modules HP of coating/developing block B3. Buffer modules BUF3 and BUF4 are designed for temporarily storing wafer W which has been subjected to processes in cooling modules CPL1 and CPL2, and peripheral exposure device WEE of interface block B4. Buffer module BUF3 is an in-buffer module which stores for the moment wafer W to be loaded in peripheral exposure device WEE, and an exposure device B5 (not shown). Buffer module BUF4 is an out-buffer module which stores for the moment wafer W unloaded from exposure device B5. Also, peripheral exposure device WEE performs a peripheral exposure process which is for exposing the periphery of wafer W having been coated with a chemical liquid in the coating module.

Wafer carrying arm 4 is movably provided in the X-direction on a carrying route 4a. Wafer carrying arm 4 is configured to move in the Z direction (vertical direction), and to selectively access heating modules HP in coating/developing block B3, and buffer modules BUF3 and BUF4, cooling modules CPL1 and CPL2, and peripheral exposure device WEE in interface block B4. Wafer carrying arm 4 transfers wafers W between heating modules HP, cooling modules CPL1 and CPL2, buffer modules BUF3 and BUF4, and peripheral exposure device WEE. Also, wafer carrying arm 4 transfers wafer W from buffer module BUF3 to exposure device B5 (not shown), and transfers wafer W which has been exposed from exposure device B5 (not shown) to buffer module BUF4.

Hereinafter, the flow of wafer W in the coating and developing apparatus will be described. First, a first-half process (flow A as described below) is carried out.

First, a FOUP is loaded as a carrier on cassette placing unit CS of carrier block B1 from the outside, and wafers W are sequentially taken out from the inside of the FOUP by wafer carrying arm 1. Wafers W are sequentially transferred from wafer carrying arm 1 to transfer unit TRS1, and sequentially carried to modules M1 to M3 within coating/developing block B3 by wafer carrying arm 2. Carried wafers W are subjected to a series of processes, including thermal process in heating modules HP through an appropriate carrying by wafer carrying arm 3, and cooling process in cooling modules CPL1 and CPL2 through carrying by wafer carrying arm 4 of interface block B4. Wafers W which have been subjected to a series of processes in modules M1 and M2 are sequentially carried to peripheral exposure device WEE by wafer carrying arm 4, and are subjected to a peripheral exposure. Wafers W which have been subjected to the peripheral exposure are sequentially carried to exposure device B5 (not shown) by wafer carrying arm 4, and then subjected to an exposure.

Wafers W which have been subjected to the exposure are sequentially carried to module M4 by wafer carrying arm 4 of interface block B4. Carried wafers W are subjected to a series of developing processes, including the thermal process in heating module HP through an appropriate carrying by wafer carrying arm 3. Wafers W which have been subjected to a series of developing processes in module M4 are temporarily stored in buffer modules BUF1 and BUF2 by wafer carrying arm 2 of buffer block B2.

After the first-half process (flow A) is completed in module M4, wafers W temporarily stored in buffer modules BUF1 and BUF2 are subjected to a latter-half process (flow B), as described below.

Wafers W are sequentially carried to module M5 within coating/developing block B3 by wafer carrying arm 2, and are subjected to a series of developing processes, including thermal process in heating modules HP through an appropriate carrying by wafer carrying arm 3. Then, wafers W are sequentially carried to module M3 by wafer carrying arm 2. Carried wafers W are subjected to a series of processes, including thermal processes in heating modules HP through an appropriate carrying by wafer carrying arm 3, and cooling processes in cooling modules CPL1 and CPL2 through carrying by wafer carrying arm 4 of interface block B4. Then, wafers W are sequentially carried to module M4 by wafer carrying arm 2, and then are subjected to a series of developing processes, including thermal process in heating modules HP through an appropriate carrying by wafer carrying arm 3. Wafers W which have been subjected to a series of developing processes in module M4 are returned to the FOUP, which is the carrier on cassette placing unit CS of carrier block B1, by wafer carrying arm 2 of buffer block B2.

In other words, in the coating and developing apparatus according to the present embodiment, substrates loaded to carrier block B1 by a carrier (FOUP) are transferred to process modules (modules M1 and M2), formed with a coating film (including a resist film) in the process modules (modules M1 and M2), and transferred to an exposure device through interface block B4, and then, the exposed substrates returned through interface block B4 are subjected to processes, including a developing process, in process modules (modules M3 to M5) and transferred to carrier block B1.

Hereinafter, a coating and developing method according to the present embodiment will be described with reference to FIGS. 3 to 4C.

Figure 3:
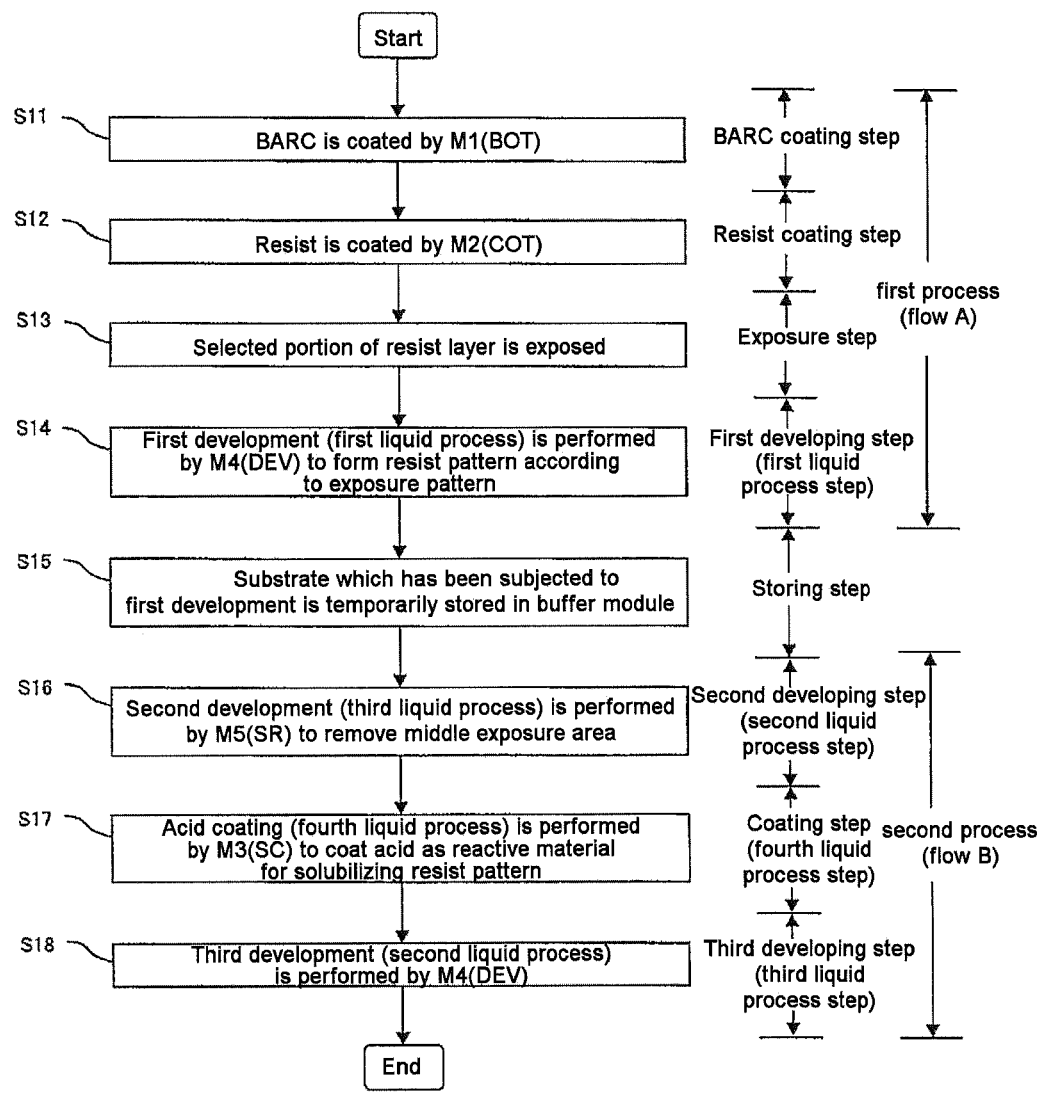
FIG. 3 is a flow chart illustrating the order of respective steps in a coating and developing method according to a first exemplary embodiment.
Figure 4A:
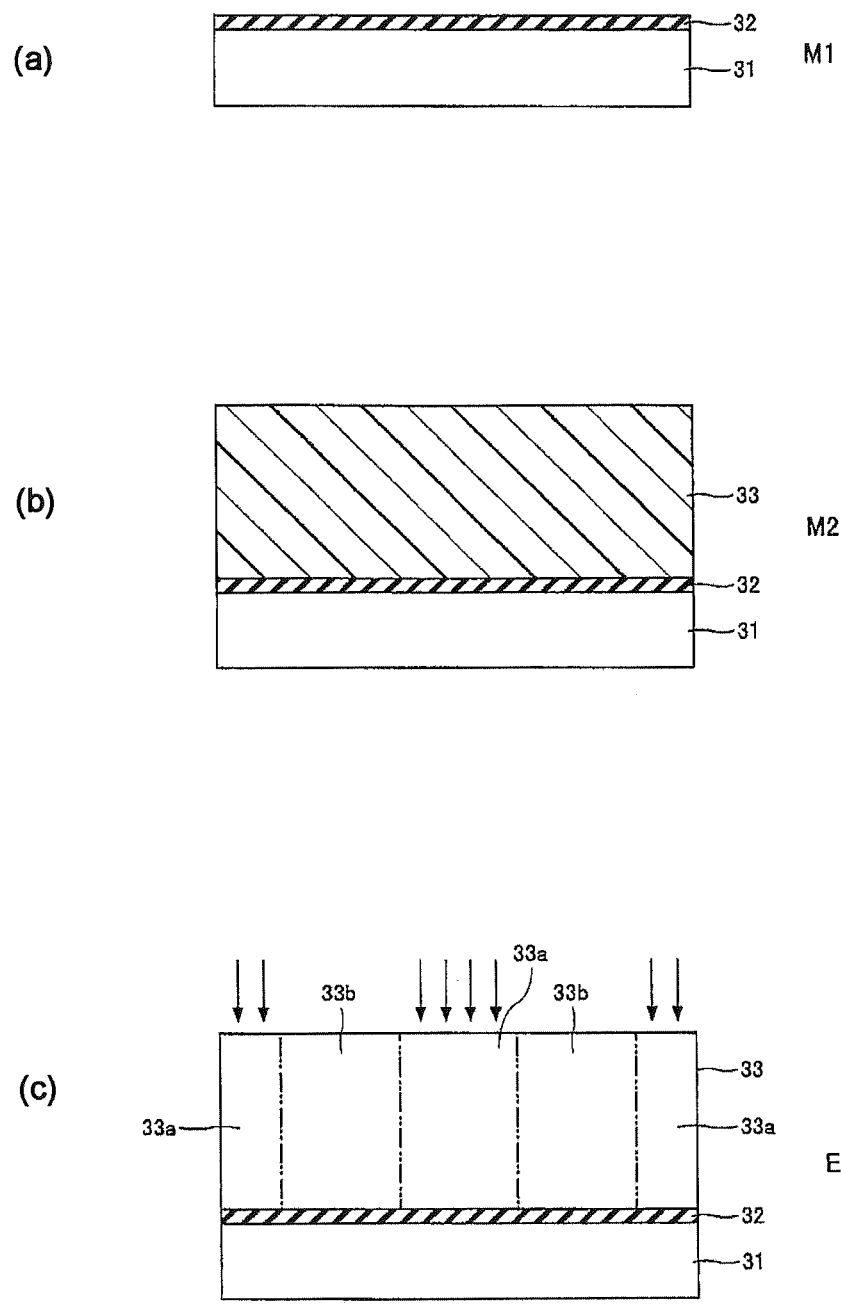
FIGS. 4A (a), (b), (c) illustrate a first cross-sectional view schematically illustrating the structure of a substrate surface in respective steps of a coating and developing method according to a first exemplary embodiment.
Figure 4B:
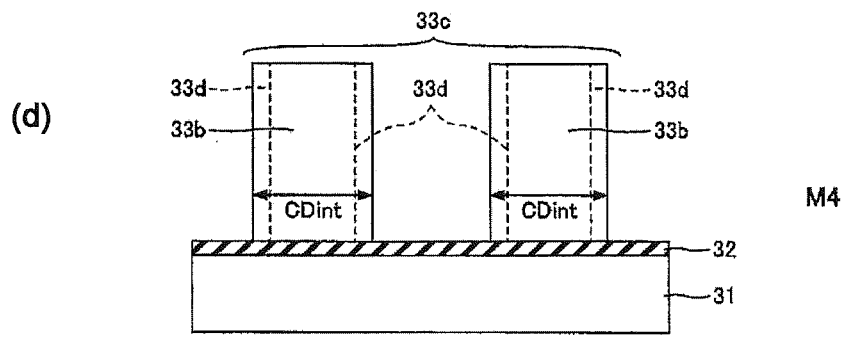
FIGS. 4B (d), (e), (f) illustrate a second cross-sectional view schematically illustrating the structure of a substrate surface in respective steps of a coating and developing method according to a first exemplary embodiment.
Figure 4B:
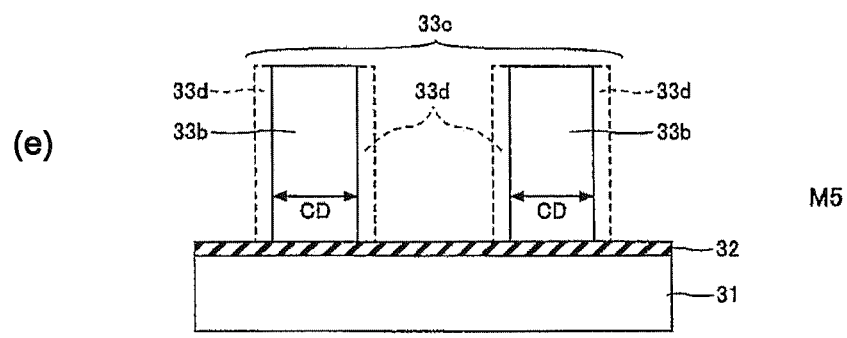
Figure 4B:
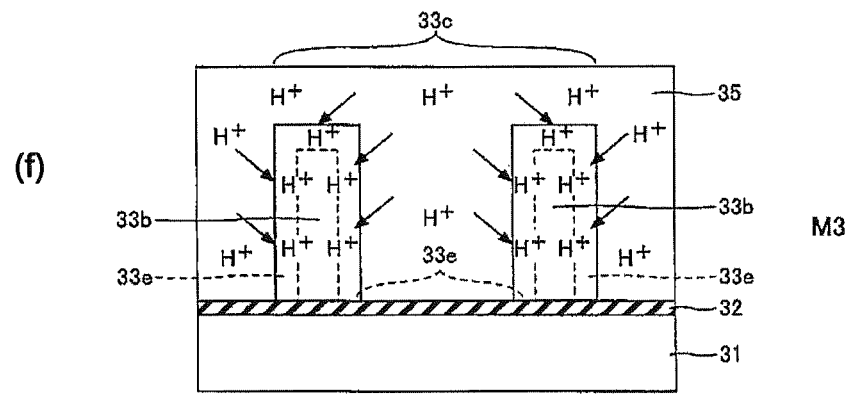

FIG. 3 shows a flow chart illustrating the order of respective steps in the coating and developing method, according to the present embodiment. FIGS. 4A to 4C show cross-sectional views schematically illustrating the structure of a substrate surface in respective steps of the coating and developing method, according to the present embodiment.

Figure 4C:
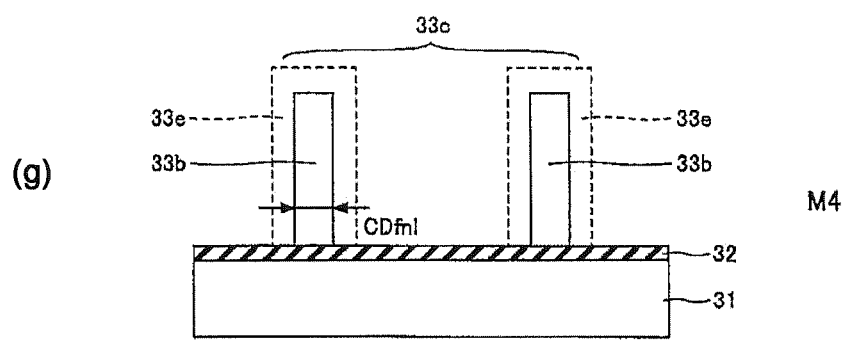
FIG. 4C (g) is a third cross-sectional view schematically illustrating the structure of a substrate surface in respective steps of a coating and developing method according to a first exemplary embodiment.

Also, FIGS. 4A (*a*) to 4B (*d*), and FIGS. 4C (*e*) to 4C (*g*), respectively, show the structure of a substrate surface after carrying out of steps S11 to S14, and steps S16 to S18. Also, in FIGS. 4A (*a*) to 4C (*g*), reference numerals of modules or devices for performing respective steps are noted at the right side on the paper.

The coating and developing method according to the present embodiment, as shown in FIG. 3, includes a BARC coating step (step S11), a resist coating step (step S12), an exposure step (step S13), a first developing step (step S14), a storing step (step S15), a second developing step (step S16), a coating step (step S17), and a third developing step (step S18). Among the steps, a first process of the first-half (flow A) corresponds to steps from the BARC coating step (step S11) to the first developing step (step S14). Also, a second process of the latter-half (flow B) corresponds to steps from the second developing step (step S16) to the third developing step (step S18).

Also, in the coating and developing method according to the present embodiment, a substrate loaded to carrier block B1 by a carrier (FOUP) is transferred to process modules (modules M1 and M2), formed with a coating film including a resist film in the process modules (modules M1 and M2), and transferred to an exposure device through interface block B4. And, then, the exposed substrate returned through interface block B4 is subjected to processes including a developing process in process modules (modules M3 to M5), and transferred to carrier block B1.

First, the BARC coating step in step S11 is carried out. In step S11, BARC is coated on an underlayer 31 on a wafer by module M1 (BARC coating module BOT), so as to form an anti-reflective film 32. The structure of a wafer surface which has been subjected to step S11 is shown in FIG. 4A (*a*).

Then, the resist coating step in step S12 is carried out. In step S12, a resist is coated on anti-reflective film 32 by module M2 (resist coating module COT). The structure of the wafer surface which has been subjected to step S12 is shown in FIG. 4A (*b*).

In step S12, then, the coated resist is solidified through the evaporation of its solvent by a pre-baking so as to form a resist film 33. As one example, the resist may be a chemically amplified resist. For example, the chemically amplified resist may be a resist which produces a solubilizing material soluble in a solvent through irradiation of light. As a specific example, the chemically amplified resist used in the present embodiment contains a photoacid generator (PAG), and is capable of withstanding exposure to an ArF excimer laser (wavelength 193 nm) as a light source. The PAG produces acid by light. Acid reacts with an alkali insoluble protecting group contained in the resist, thereby changing the alkali insoluble protecting group into an alkali soluble group (a solubilizing material). As one example, the reaction may be an acid catalytic reaction.

Then, the exposure step in step S13 is carried out. In step S13, the wafer is carried to an exposure device EXP provided at interface block B4 side of the coating and developing apparatus, and a selected part of resist film 33 is exposed by exposure device EXP. The structure of the wafer surface which has been subjected to step S13 is shown in FIG. 4A (*c*).

In step S13, as shown in FIG. 4A (*c*), the selected part of resist film 33 is exposed to selectively produce a solubilizing material soluble in an alkaline solvent (developer). The resist of the present embodiment is a chemically amplified resist containing a PAG. Also, after the exposure, post exposure baking (PEB) is carried out, which is for facilitating a change of the alkali insoluble protecting group into the alkali soluble group (the solubilizing material) by activating the acid produced in resist film 33. As described above, the selective production of the solubilizing material provides, within resist film 33, for example, an exposure pattern which includes patterns having a soluble layer 33*a* soluble in the alkaline solvent (developer) and an insoluble layer 33*b* insoluble in the alkaline solvent (developer).

Then, the first developing step in step S14 is carried out. In step S14, the wafer is returned to the coating and developing apparatus, and is subjected to a first developing process using a first developer by module M4 (first developing module DEV) so as to form a resist pattern 33*c* according to the exposure pattern. The structure of the wafer surface which has been subjected to step S14 is shown in FIG. 4B (*d*).

In step S14, soluble layer 33*a* is removed from resist film 33 formed with the exposure pattern, so as to form resist pattern 33*c* according to the exposure pattern. In the present embodiment, in a state where the wafer is rotated, an alkaline solvent (developer) is supplied on resist film 33 formed with the exposure pattern to remove soluble layer 33*a*. Accordingly, resist pattern 33*c* including insoluble layer 33*b* is formed. Then, post-baking is carried out, if necessary, so as to harden resist pattern 33c. After step S14 is carried out, resist pattern 33c has a line width of CDint.

Then, the storing step in step S15 is carried out. In step S15, the substrate which has been subjected to the first developing step is temporarily stored in buffer module BUF.

Then, the second developing step in step S16 is carried out. In step S16, the wafer taken out from buffer module BUF after the storing step is subjected to a second developing process using a second developer by module M5 (second developing module SR) so as to remove a middle exposure area 33d from resist pattern 33c. The structure of the wafer surface which has been subjected to step S16 is shown in FIG. 4B (e).

Resist film 33 which has been subjected to the first developing step has, at the lateral side thereof, an area having an in-between characteristic of soluble layer 33a and insoluble layer 33b. The area may include a soluble area whose solubilization is not completely proceeded, or an insoluble area having a slight soluble group. Hereinafter, such an area is referred to as middle exposure area 33d. The cause of generation of middle exposure area 33d is that, for example, it has been difficult to secure a contrast with a sufficient exposure dose in a boundary between a to-be-exposed area and a not-to-be-exposed area, as a semiconductor device is miniaturized.

The second developer used in step S16 may have a higher temperature or a higher concentration than the first developer. For example, the second developer may have a temperature of 23° C. to 50° C., and a concentration of 2.38% to 15%. Also, the developing process may be carried out for a developing time of 20 sec to 300 sec, thereby removing middle exposure area 33d. By removing middle exposure area 33d, it is possible to achieve a thinner line width CD of resist pattern 33c, compared to the line width CDint achieved through the first developing step.

Right after the last substrate W25, from among 25 substrates which are sequentially to be subjected to the flow A included in a substrate group L1, is subjected to the first developing step (step S14), the first substrate W1 of substrate group L1 is subjected to the third developing step (step S18) described below. Accordingly, before the first developing step (step S14) performed on last substrate W25 is ended, the second developing step (step S16) to be performed on first substrate W1 is started.

Specifically, as described below with reference to FIG. 6, the second developing step to be performed on first substrate W1 is started ahead of the point of time when the first developing step performed on last substrate W25 is ended by the combined time $\Delta t$ of the second developing step and the coating step to be performed on one substrate.

Then, the coating step in step S17 is carried out. In step S17, acid as a reactive material for solubilizing resist pattern 33c is coated on resist pattern 33c by module M3 (slimming coating module SC). The structure of the wafer surface which has been subjected to step S17 is shown in FIG. 4B (f).

In step S17, a solution 35 containing acid as a reactive material for solubilizing resist pattern 33c is coated on resist pattern 33c. As an exemplary solution containing acid, TARC (Top Anti-Reflection Coating) may be used. Also, in step S17, after solution 35 containing acid as the reactive material is coated, a thermal process may be performed under a predetermined thermal process condition, so as to diffuse the acid as the reactive material within resist pattern 33c.

In step S17, the acid as the reactive material is diffused within resist pattern 33c, thereby forming a new soluble layer 33e on the surface of resist pattern 33c. Wafer W formed with resist pattern 33c may be subjected to a thermal process by using heating module PEB, or the like, of the coating and developing apparatus. The thermal process may activate the acid (H+) diffused within resist pattern 33c, and may facilitate the change from insoluble layer 33b into new soluble layer 33e. For example, the change from insoluble layer 33b into new soluble layer 33e may include a change from an alkali insoluble protecting group into an alkali soluble group (a solubilizing material) with catalysis of acid (H+).

Also, if the thermal process temperature is too high, pattern collapse or pattern distortion may be caused. Thus, an upper limit of the baking temperature may be set. The upper limit of the thermal process temperature is changeable according to the kind of resist constituting resist pattern 33c, but may be set as 110° C. in one example described in the present embodiment. Also, the thermal process temperature may range from 50° C. to 180° C.

Then, the third developing step in step S18 is carried out. In step S18, from resist pattern 33c formed with new soluble layer 33e, new soluble layer 33e is removed by using the first developer through module M4 (first developing module DEV). The structure of the wafer surface which has been subjected to step S18 is shown in FIG. 4C (g).

In step S18, on resist pattern 33c formed with new soluble layer 33e, the first developer is supplied as an alkaline solvent, so as to remove new soluble layer 33e. Also, after step S18 is carried out, a post-baking is carried out, if necessary, so as to harden resist pattern 33c.

According to the present embodiment, after the first developing step shown in FIG. 4B (d), a step for removing middle exposure area 33d (the second developing step) shown in FIG. 4B (e), a step for forming new soluble layer 33e on the surface of resist pattern 33c (the coating step) shown in FIG. 4B (f), and a step for removing new soluble layer 33e (the third developing step) shown in FIG. 4C (g), are carried out. By removing middle exposure area 33d and new soluble layer 33e, it is possible to achieve a thinner line width CDfnl of resist pattern 33c, compared to the line width CDint achieved through the first developing step.

Hereinafter, the method for sequentially coating/developing a plurality of substrates by using the coating and developing apparatus according to the present embodiment will be described with reference to FIGS. 5 and 6.

Figure 5:
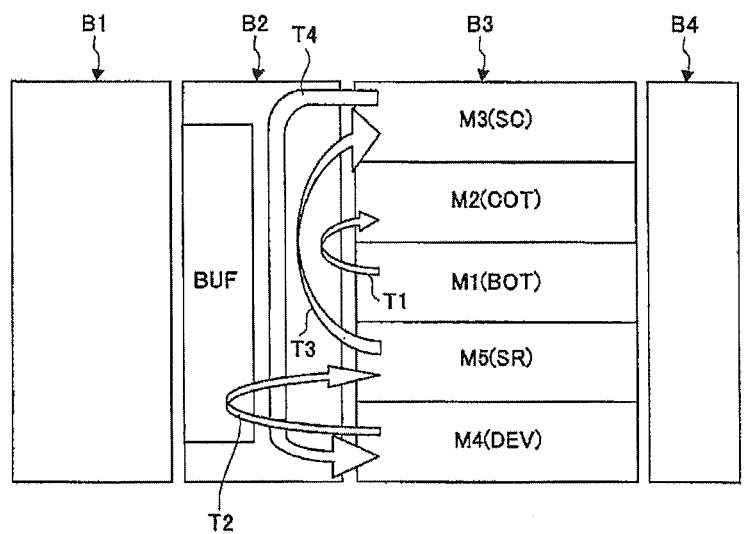
FIG. 5 is a schematic plan view schematically illustrating the configuration of a coating and developing apparatus according to a first exemplary embodiment.

FIG. 5 shows a schematic plan view schematically illustrating the configuration of the coating and developing apparatus according to the present embodiment. FIG. 6 shows a time chart illustrating the processing state of wafers in each module during the performance of the coating and developing method according to the present embodiment.

As shown in FIG. 5 (a simplified view of FIG. 2), in the coating and developing apparatus according to the present embodiment, in the order from bottom to top, module M4 (first developing module DEV), module M5 (second developing module SR), module M1 (BARC coating module BOT), module M2 (resist coating module COT), and module M3 (slimming coating module SC) are overlappingly disposed.

Also, as shown in FIG. 5, the coating and developing apparatus according to the present embodiment has buffer module BUF for temporarily storing wafers in buffer block B2 provided between coating/developing block B3 and carrier block B1. Accordingly, the buffer module is provided near the coating module, the buffer module is provided.

Figure 6:
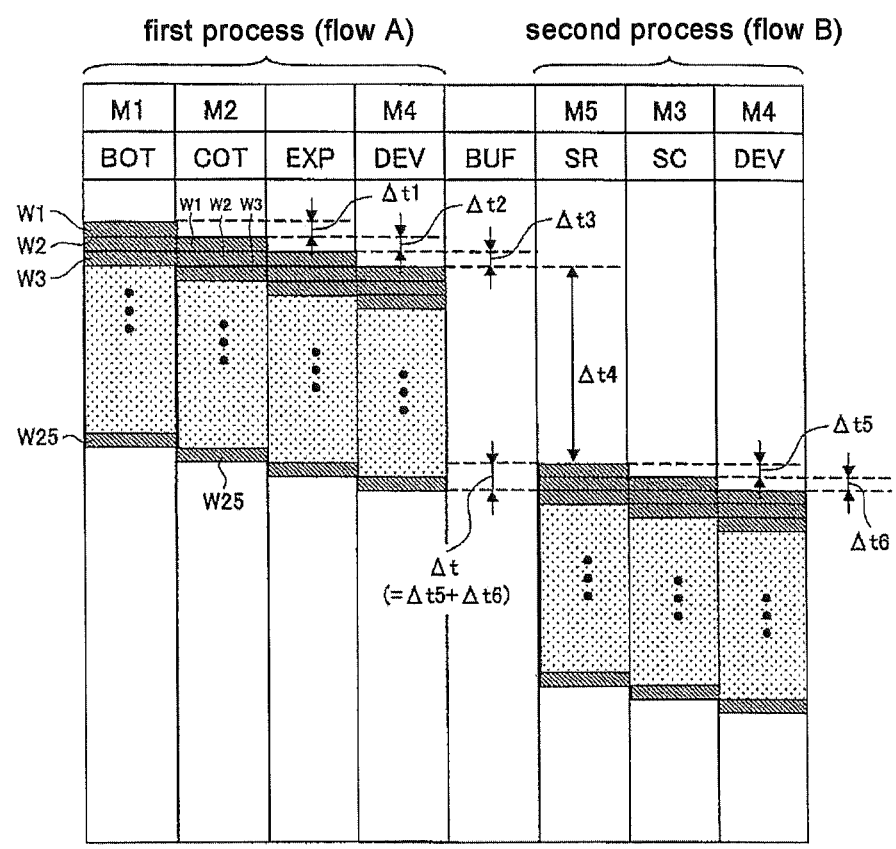
FIG. 6 is a time chart illustrating the processing state of wafers in each module during the performance of a coating and developing method according to a first exemplary embodiment.

As shown in FIGS. 5 and 6, in the present embodiment, a lot L1 including 25 wafers W1 to W25 is input, and the first process of the first-half (flow A) and the second process of the latter-half (flow B) are carried out.

In the first process of the first-half (flow A), respective wafers W in input lot L1 are sequentially carried to module M1 (BARC coating module BOT), and are sequentially coated with BARC. Respective wafers W which have been sequentially coated with BARC, are sequentially carried to module M2 (resist coating module COT) (carrying T1) in a direct way or via buffer module BUF, and are sequentially coated with a resist. Respective wafers W which have been sequentially coated with a resist, are exposed in a direct way or via buffer module BUF, and then are carried to module M4 (first developing module DEV) and subjected to the first developing process.

After carrying out of the first developing process as described above, wafers which have been subjected to the first process (flow A), are temporarily stored in buffer module BUF until the second process (flow B) is started (carrying T2).

Meanwhile, in the second process of the latter-half (flow B), respective wafers W stored in buffer module BUF are sequentially carried to module M5 (second developing module SR) (carrying T2), and are sequentially subjected to the second developing process. Wafers W which have been subjected to the second developing process are carried to module M3 (slimming coating module SC) (carrying T3), and coated with acid as a reactive material. Wafers W which have been coated with acid as the reactive material, are carried to module M4 (first developing module DEV) in a direct way or via buffer module BUF (carrying T4), and subjected to the third developing process.

Hereinafter, the processing state of a plurality of wafers in a module during the performance of the coating and developing method according to the present embodiment will be described with reference to the time chart in FIG. 6.

In the present embodiment, when a lot including a plurality of wafers is input, and the above described coating and developing method is performed on respective wafers of the input lot, the method is divided into the first process of the first-half (flow A) and the second process of the latter-half (flow B) as shown in FIG. 3.

Also, in the description below, the description on heating and cooling processes which are appropriately carried out after the carrying out of coating in each coating module will be omitted.

In the coating and developing method according to the present embodiment, lot L1 including a plurality of (for example, 25) wafers W stored in a FOUP is input, and then, respective wafers W (W1, W2, W3, ... W25) of input lot L1 are sequentially subjected to the first process (flow A), and are stored in buffer module BUF. Also, processes in module M4 (first developing module DEV) commonly used in the first process (flow A) and the second process (flow B) are carried out as described below. In other words, right after the first developing step (step S14) on last wafer W25 is ended in the first process (flow A), the third developing step (step S18) on first wafer W1 has to be started in the second process (flow B). Accordingly, before the first developing step (step S14) performed on last wafer W25 is ended, the second developing step (step S16) on first wafer W1 is started by taking out first wafer W1 from buffer module BUF.

First, the first process (flow A) is carried out. First of all, on 25 wafers W, in the order of W1, W2, W3, ... W25, the BARC coating step is sequentially carried out by module M1 (BARC coating module BOT). Respective wafers W which have been coated with BARC, are sequentially carried to module M2 one by one (resist coating module COT) (carrying T1) by wafer carrying arm 2, and are sequentially subjected to the resist coating step in the order of W1, W2, W3, ... W25. The point of time when the resist coating step is carried out in module M2 (resist coating module COT) is sequentially delayed by $\Delta t1$, which is the processing time of one wafer in module M1 (BARC coating module BOT).

Respective wafers W which have been subjected to the resist coating step in module M2 (resist coating module COT) are sequentially exposed in exposure device EXP. The point of time when the exposure is carried out in exposure device EXP is sequentially delayed by $\Delta t2$, which is the processing time of one wafer in module M2 (resist coating module COT).

Then, in the same manner, respective wafers W (W1, W2, W3 ... W25) are sequentially carried to module M4 (first developing module DEV), and subjected to a process with a sequential delay by $\Delta t3$ (the processing time). Then, after carrying out of the first developing step in module M4 (first developing module DEV), wafers W are sequentially stored in buffer module BUF (carrying T2).

Then, on wafers W stored in buffer module BUF, the second process of the latter-half (flow B) is carried out. Herein, the second developing step in module M5 (second developing module SR) of the second process (flow B) is carried out with a sequential delay by $\Delta t4$. Also, the second developing step on first wafer W1 may be started before the first developing step on last wafer W25 is ended.

This is because that buffer module BUF is provided near module M4 (first developing module DEV), and module M5 (second developing module SR), and wafer W can be directly transferred by one wafer carrying arm 2, between buffer module BUF, module M4, and module M5.

Respective wafers W which have been subjected to the second developing step in module M5 (second developing module SR), are carried to module M3 one by one (slimming coating module SC) by wafer carrying arm 2, and are subjected to the coating step. The point of time when the coating step is carried out in module M3 (slimming coating module SC) is sequentially delayed by $\Delta t5$, which is the processing time of one wafer in module M5 (second developing module SR).

Then, in the same manner, after the coating step in module M3 (slimming coating module SC), respective wafers W (W1, W2, W3 ... W25) are subjected to the third developing step in module M4 (first developing module DEV) with a sequential delay of $\Delta t6$. Also, then, respective wafers W are stored in the FOUP of carrier block B1.

Meanwhile, in a conventional coating and developing apparatus, there is no buffer module provided near a coating module. Hereinafter, the method for sequentially coating/developing a plurality of substrates by using a conventional coating and developing apparatus will be described with reference to FIGS. 7 and 8 through comparison.

Figure 7:
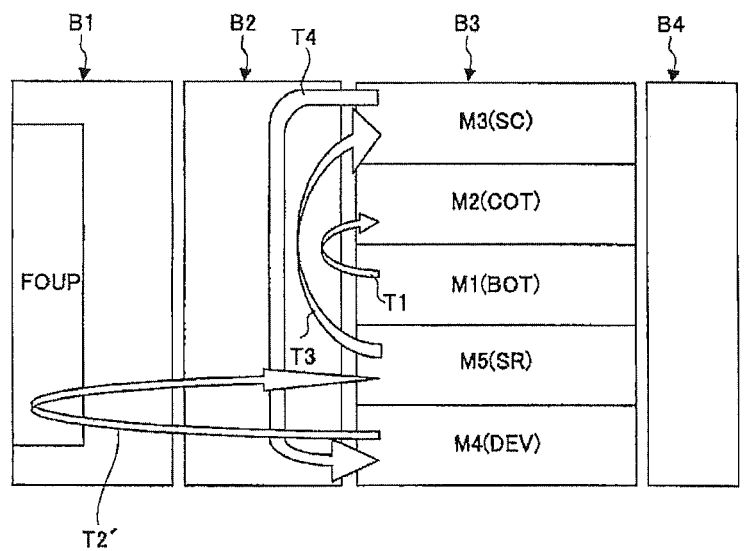
FIG. 7 is a schematic plan view schematically illustrating the configuration of a conventional coating and developing apparatus.
Figure 8:
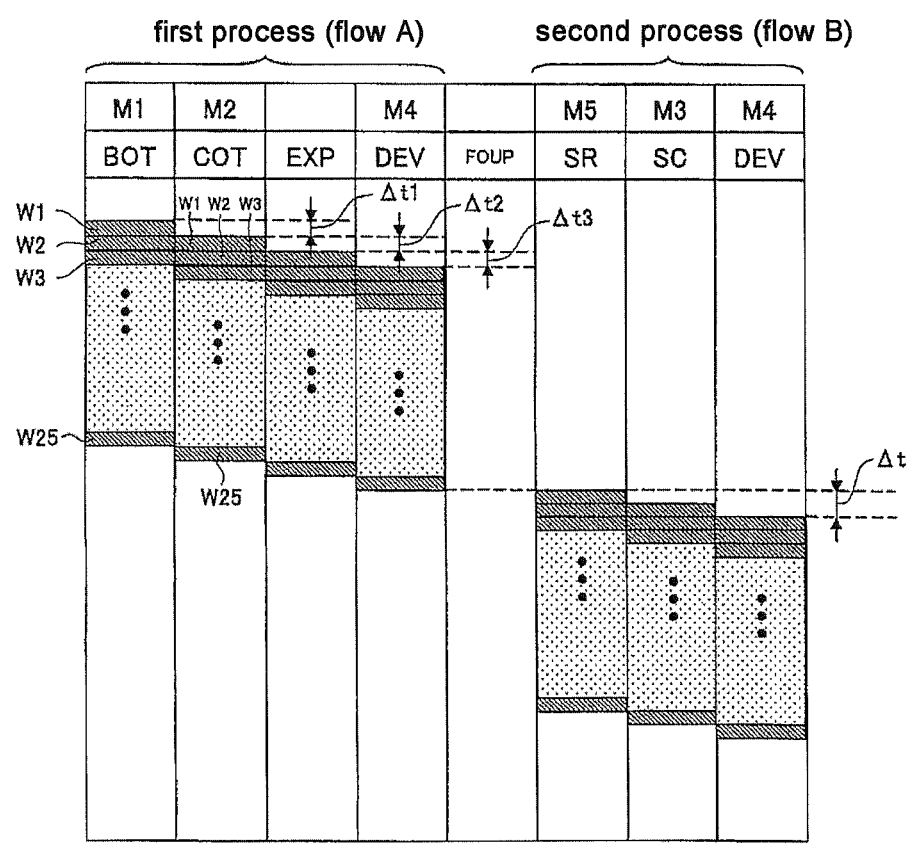
FIG. 8 is a time chart illustrating the processing state of wafers in each module during the performance of a conventional coating and developing method.
Figure 9B:
Figure 9B:
Figure 9C:
Figure 9D:
Figure 9E:
Figure 9E:

FIG. 7 shows a plan view schematically illustrating the configuration of a conventional coating and developing apparatus. FIG. 8 shows a time chart illustrating the processing state of wafers in each module during the performance of a conventional coating and developing method.

As shown in FIG. 7, as a comparison example, in a developing system, in the order from bottom to top, module M4 (first developing module DEV), module M5 (second developing module SR), module M1 (BARC coating module BOT), module M2 (resist coating module COT), and module M3 (slimming coating module SC) are overlappingly disposed.

However, the coating and developing apparatus, as the comparison example, has no buffer module for temporarily storing wafers, in buffer block B2 provided between coating/developing block B3 and carrier block B1. Accordingly, in the coating and developing apparatus, as the comparison example, wafers which have been subjected to the first process are returned to and stored in a FOUP of carrier block B1.

Hereinafter, the processing state of a plurality of wafers in each module during the performance of the coating and developing method as a comparison example will be described with reference to the time chart in FIG. 8.

In the same manner as the present embodiment, in the comparison example, when the above described coating and developing method is performed on a plurality of wafers, the method is divided into a first process of the first-half and a second process of a latter-half.

Also, in the description of the comparison example, the description on the heating and cooling processes which are appropriately carried out after the carrying out of the coating process in each coating module will be omitted.

First, in the same manner as the present embodiment, a plurality of (for example, 25) wafers W (W1, W2, W3, . . . W25) stored in a FOUP are sequentially subjected to the first process (flow A). Also, in the same manner as the present embodiment, respective modules M2, EXP, and M4 are sequentially delayed compared to modules M1, M2, and EXP, respectively, by $\Delta t1$, $\Delta t2$, and $\Delta t3$. However, in the comparison example, after carrying out of the first developing step in module M4 (first developing module DEV), respective wafers W (W1, W2, W3 . . . W25) are returned to the FOUP, and are sequentially stored (carrying T2').

Then, on wafers W (W1, W2, W3 . . . W25) stored in the FOUP, the second process of the latter-half (flow B) is carried out. However, in the comparison example, the second developing step cannot be started by carrying wafers from the FOUP to module M5 (second developing module SR) (carrying T2'), until the first developing step on last wafer W25 is ended. Since there is no buffer module for standby of module processes through repetitive supplies, it is required to return respective wafers W to the FOUP.

Accordingly, in the comparison example, the point of time when the second process (flow B) is started is delayed by $\Delta t$ as shown in FIG. 8, compared to the point of time when the second process (flow B) can be started in the present embodiment. In other words, in the present embodiment with a buffer module BUF, a total access time (TAT) for processing all wafers W (W1, W2, W3 . . . W25) of lot L1 is shortened by $\Delta t$, compared to the comparison example with no buffer module BUF.

Herein, $\Delta t$ may be set as $\Delta t=\Delta t5+\Delta t6$ by using $\Delta t5$, which is a processing time for one wafer in module M5 (second developing module SR), and $\Delta t6$, which is a processing time for one wafer in module M3 (coating module SC).

Hereinafter, an advantage in that a total access time (TAT) is further shortened, during processes on a plurality of substrate groups (lots) including a plurality of substrates (wafers) through the coating and developing apparatus and the coating and developing method according to the present embodiment, will be described with reference to FIGS. 9A through 9F.

FIGS. 9A through 9F show a time chart illustrating the processing state of wafers in each module during performing the coating and developing method according to the present embodiment, and a conventional coating and developing method on respective wafers of two lots L1 and L2. Each of two lots L1 and L2 includes 25 wafers W (W1, W2, W3 . . . W25).

In FIGS. 9A through 9F, the left part with respect to the center shows the coating and developing method according to the present embodiment, that is, a preceding process through buffer module BUF in which a part of the second process (flow B) is precedently started before the first process (flow A) is completely ended. Also, in FIGS. 9A through 9F, the right part with respect to the center shows the conventional coating and developing method in which wafers are returned to the FOUP in each flow and the second process (flow B) is started after the first process (flow A) is completely ended.

As shown in FIGS. 9A through 9F, compared to the conventional method, the point of time the second process (flow B) performed on last wafer W25 of first lot L1 is ended in the method according to the present embodiment may be preceded by 3 wafers. Also, compared to the conventional method, the point of time the second process (flow B) performed on last wafer W25 of second lot L2 is ended in the method according to the present embodiment may be preceded by 10 wafers. In the same manner, in the method according to the present embodiment, as the number of input lots (that is, to-be-processed wafers) is increased, the total access time (TAT) can be shortened compared to the conventional method.

According to the present embodiment, a buffer module is provided near a coating unit and developing unit, which are overlappingly disposed on top of each other. Herein, a wafer which has been subjected to the first process of the first-half is temporarily stored in the buffer module provided near a module in which the latter-half second process is started. Accordingly, at the start of the second process of the latter-half, before the first process of the first-half is completely performed on all substrates, the second process of the latter-half may be precedently performed on a part of the plurality of substrates. Also, since there is no need to return wafers to the FOUP at the time point of completion of a lot or completion of each process step, it is possible to minimize a wafer processing route. Accordingly, it is possible to shorten the total access time (TAT).

Second Embodiment

Hereinafter, a heating device according to the second embodiment will be described with reference to FIGS. 10 to 16. The coating and developing apparatus and the coating and developing method according to the present embodiment are different from the first embodiment, in that module M3 is shared by the first process (flow A) and the second process (flow B).

Figure 10:
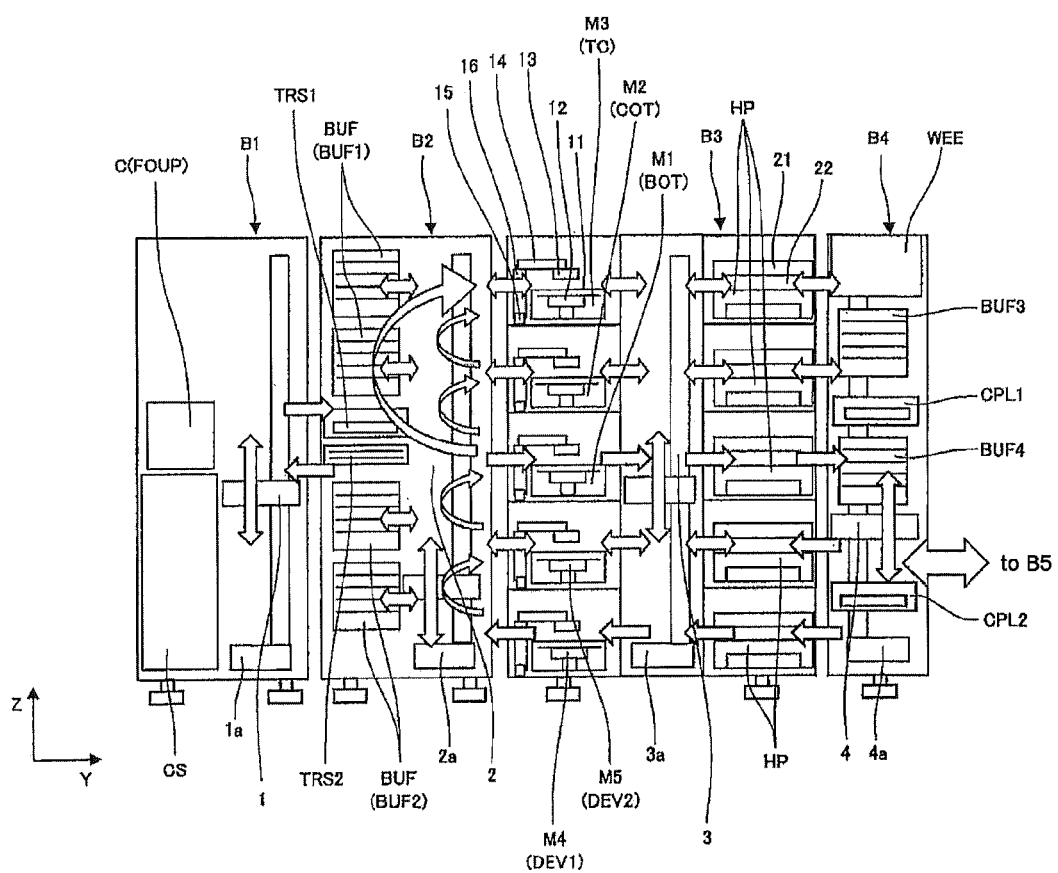
FIG. 10 is a schematic plan view illustrating the configuration of a coating and developing apparatus according to a second exemplary embodiment.

FIG. 10 shows a schematic plan view illustrating the configuration of the coating and developing apparatus according to the present embodiment.

The coating and developing apparatus according to the present embodiment has the same configuration as the first embodiment, in that it includes inspection block B1' and hydrophobization/thermal-process block B2' between carrier block B1, buffer block B2, and interface block B4. Also, the coating and developing apparatus according to the present embodiment has the same coating/developing block B3 as the first embodiment, except for modules M3, M4, and M5.

In the present embodiment, module M3 can coat a top-coat as well as acid as a reactive material for solubilizing the resist. In other words, module M3 is a top-coat coating module TC. Also, module M4 is set as a first developing module DEV1, and module M5 is set as a second developing module DEV2.

Also, in the present embodiment, module M3 (top-coat coating module TC) corresponds to a coating module and to a first liquid process module in the present disclosure. Also, in the present embodiment, module M4 (first developing module DEV1) corresponds to a first developing module and to a second liquid process module in the present disclosure. Also, in the present embodiment, module M5 (second developing module DEV2) corresponds to a second developing module and to a third liquid process module in the present disclosure. Also, the chemical liquid for coating a top-coat for covering a substrate surface coated with a resist in module M3 (top-coat coating module TC) corresponds to a first chemical liquid in the present disclosure. Also, the acid which is a reactive material for solubilizing the resist used in module M3 (top-coat coating module TC) corresponds to a second chemical liquid in the coating and developing apparatus according to the present disclosure, and to a third chemical liquid in the coating and developing method according to the present disclosure. Also, the first developer used in module M4 (first developing module DEV1) corresponds to a third chemical liquid in the coating and developing apparatus according to the present disclosure, and to a second chemical liquid in the coating and developing method according to the present disclosure. Also, a second developer used in M5 (second developing module DEV2) corresponds to a fourth chemical liquid in the present disclosure.

Also, in the same manner as the first embodiment, modules M1 to M5 need only directly transfer wafers between buffer modules BUF1 and BUF2, and modules M1 to M5, by wafer carrying arm 2 (one substrate carrying arm). Accordingly, in the same manner as the first embodiment, the present embodiment is not limited to the case where modules M1 to M5 are overlappingly disposed on top of each other, and may employ various dispositions such as a side-by-side disposition within a horizontal plane.

Also, modules M1, M2, M4, and M5 have an approximately the same configuration, which are the same as the configuration described in the first embodiment.

Meanwhile, module M3 (top-coat coating module TC) is different from that of the first embodiment, in which two groups are provided for a chemical liquid for coating the top-coat, and a reactive material for solubilizing the resist, each of which includes nozzle 13, nozzle scan arm 14, and vertical supporting member 16, as described above with reference to FIG. 1.

Heating module HP, and wafer carrying arm 3 may be the same as those of the first embodiment. Also, a chemical chamber, a machine room, and rinse cleaning block B3' may be provided in the same manner as those of the first embodiment.

Hereinafter, the flow of wafer W in a coating and developing apparatus will be described. First, a FOUP is loaded as a carrier on cassette placing unit CS of carrier block B1 from the outside, and wafers W are taken out from the inside of the FOUP by wafer carrying arm 1. Wafers W are transferred from wafer carrying arm 1 to transfer unit TRS1, and sequentially carried to modules M1 to M3 within coating/developing block B3 by wafer carrying arm 2. Carried wafers W are subjected to a series of processes including a thermal process in heating modules HP through appropriate carrying by wafer carrying arm 3, and a cooling process in cooling modules CPL1 and CPL2 through carrying by wafer carrying arm 4 of interface block B4. Wafers W which have been subjected to a series of processes in modules M1 and M2 are carried to peripheral exposure device WEE by wafer carrying arm 4, and are subjected to a peripheral exposure. Wafers W which have been subjected to the peripheral exposure are carried to exposure device B5 (not shown) by wafer carrying arm 4, and then are subjected to an exposure.

Wafers W which have been subjected to the exposure are sequentially carried to modules M4 and M5 by wafer carrying arm 4 of interface block B4. Carried wafers W are subjected to a series of developing processes including a thermal process in heating module HP through appropriate carrying by wafer carrying arm 3. Wafers W which have been subjected to a series of developing processes in modules M4 and M5 are temporarily stored in buffer modules BUF1 and BUF2 by wafer carrying arm 2 of buffer block B2.

After the previous process is completed in module M3, wafers W temporarily stored in buffer modules BUF1 and BUF2 are carried again to module M3 within coating/developing block B3 by wafer carrying arm 2 as described below. Carried wafers W are subjected to a series of processes including a thermal process in heating modules HP through appropriate carrying by wafer carrying arm 3, and a cooling process in cooling modules CPL1 and CPL2 through carrying by wafer carrying arm 4 of interface block B4. Then, wafers W are carried to module M4 by wafer carrying arm 2, and then are subjected to a series of slimming processes including a thermal process in heating modules HP through appropriate carrying by wafer carrying arm 3. Wafers W which have been subjected to a series of slimming processes in module M4 are returned to the FOUP which is the carrier on cassette placing unit CS of carrier block B1 by wafer carrying arm 2 of buffer block B2.

In other words, in the same manner as the first embodiment, in the coating and developing apparatus according to the present embodiment, substrates loaded to carrier block B1 by a carrier (FOUP) are transferred to process modules (modules M1 to M3), are formed with a coating film including a resist film in the process modules (modules M1 to M3), and transferred to an exposure device through interface block B4. And then, the exposed substrates returned through interface block B4 are subjected to a developing process in process modules (modules M4 and M5), and transferred to carrier block B1.

Hereinafter, a coating and developing method according to the present embodiment will be described with reference to FIGS. 11 to 12c.

Figure 11:
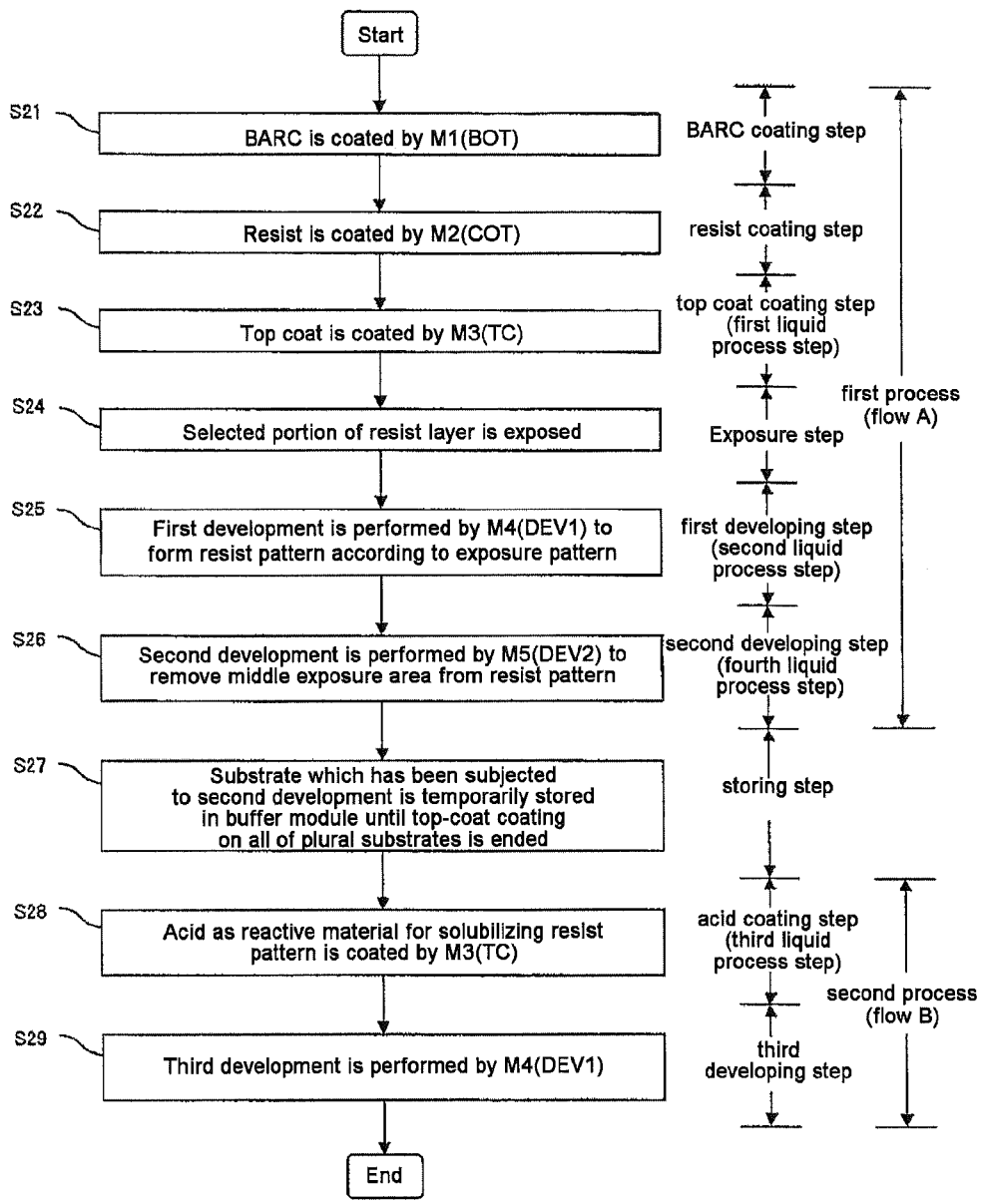
FIG. 11 is a flow chart illustrating the order of respective steps in a coating and developing method according to a second exemplary embodiment.
Figure 12A:
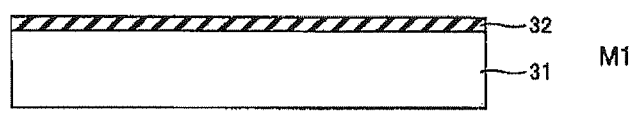
FIGS. 12A (*a*), (*b*), (*c*) illustrate a first cross-sectional view schematically illustrating the structure of a substrate surface in respective steps of a coating and developing method according to a second exemplary embodiment.
Figure 12A:
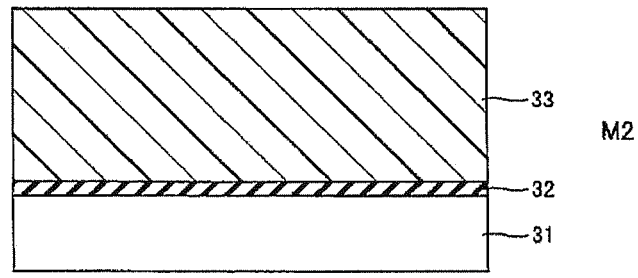
Figure 12A:
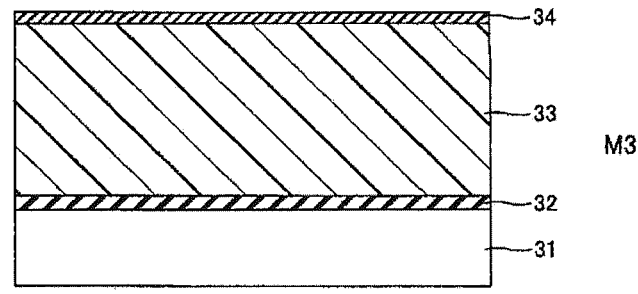
Figure 12B:
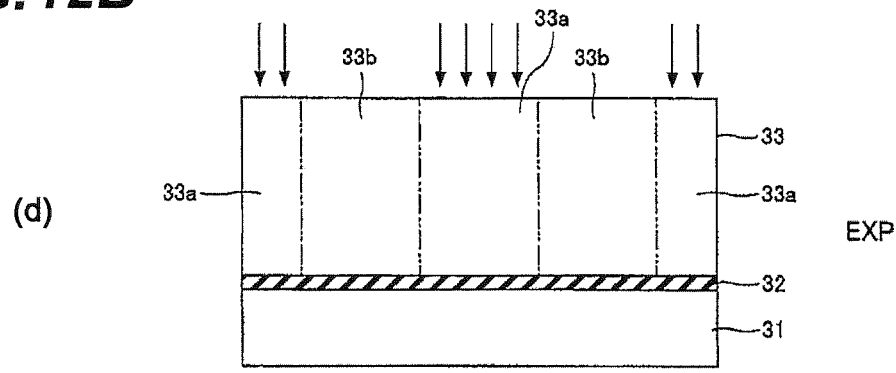
FIGS. 12B (*d*), (*e*), (*f*) illustrate a second cross-sectional view schematically illustrating the structure of a substrate surface in respective steps of a coating and developing method according to a second exemplary embodiment.
Figure 12B:
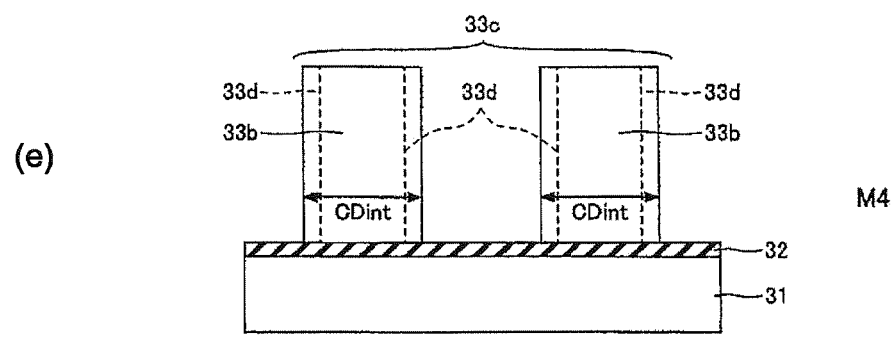
Figure 12B:
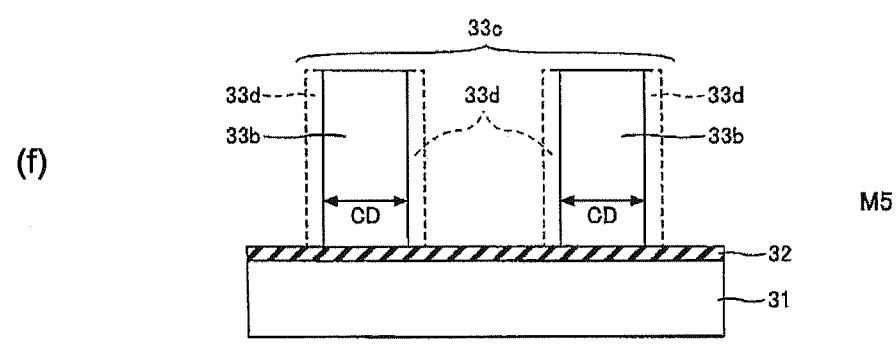

FIG. 11 shows a flow chart illustrating the order of respective steps in the coating and developing method according to the present embodiment. FIGS. 12a to 12c show cross-sectional views schematically illustrating the structure of a substrate surface in respective steps of the coating and developing method according to the present embodiment.

Figure 12C:
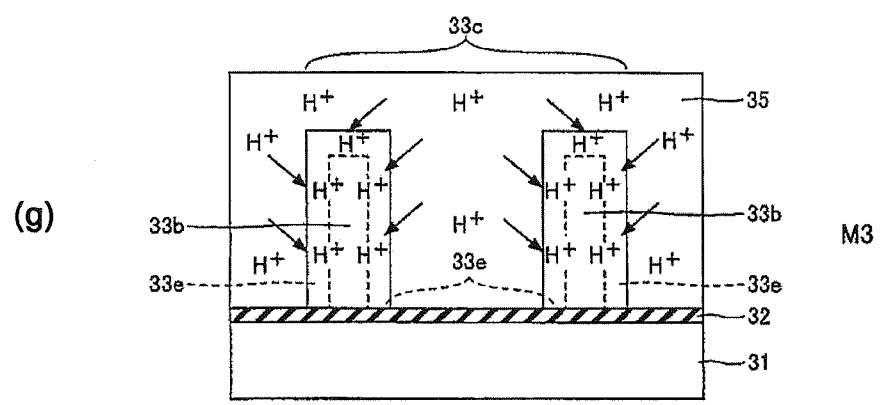
FIGS. 12C (*g*), (*h*) illustrate a third cross-sectional view schematically illustrating the structure of a substrate surface in respective steps of a coating and developing method according to a second exemplary embodiment.
Figure 12C:
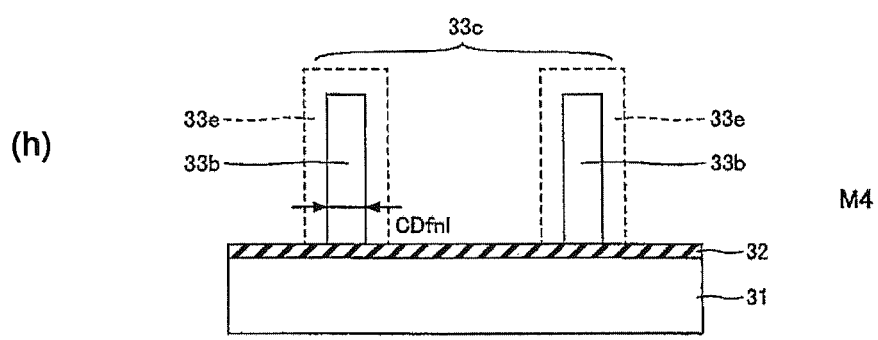

Also, FIGS. 12a (a) to 12b (f), and FIGS. 12c (g) and 12c (h), respectively, show the structure of a substrate surface after carrying out of steps S21 to S26, and steps S28 and S29. Also, in FIGS. 12a (a) to 12c (h), reference numerals of modules or devices for performing respective steps are noted at the right side on the paper.

The coating and developing method according to the present embodiment, as shown in FIG. 11, includes a BARC coating step (step S21), a resist coating step (step S22), a top-coat coating step (step S23), an exposure step (step S24), a first developing step (step S25), a second developing step (step S26), a storing step (step S27), an acid coating step (step S28), and a third developing step (step S29). Among the steps, a first process of a first-half (flow A) corresponds to steps from the BARC coating step (step S21) to the second developing step (step S26). Also, a second process of a latter-half (flow B) corresponds to the acid coating step (step S28) and the third developing step (step S29).

In the coating and developing method according to the present embodiment, a substrate loaded to carrier block B1 by a carrier (FOUP) is transferred to process modules (modules M1 to M3), are formed with a coating film including a resist film, in the process modules, and transferred to an exposure device through interface block B4. And then, the exposed substrate returned through interface block B4 is subjected to a developing process in process modules (modules M4 and M5), and transferred to carrier block B1.

First, the BARC coating step in step S21 is carried out. Step S21 may be carried out in the same manner as step S11 in the first embodiment. The structure of a wafer surface which has been subjected to step S21 is shown in FIG. 12A (a).

Then, the resist coating step in step S22 is carried out. Step S22 may be carried out in the same manner as step S12 in the first embodiment. The structure of the wafer surface which has been subjected to step S22 is shown in FIG. 12A (b).

Then, the top-coat coating step in step S23 is carried out. In step S23, a chemical liquid for forming the top-coat on resist film 33 is coated by module M3 (top-coat coating module TC) so as to form a top-coat film 34. The structure of the wafer surface which has been subjected to step S23 is shown in FIG. 12A (c). Top-coat film 34 provides a water repellent function to the surface of resist film 33, and thus is formed in such a manner that it can cover resist film 33. However, since top-coat film 34 is a thin film covering the surface of resist film 33, an illustration thereof is omitted in the drawings from FIG. 12B (d) and thereafter.

Then, the exposure step in step S24 is carried out. Step S24 may be carried out in the same manner as step S13 in the first embodiment. The structure of the wafer surface which has been subjected to step S24 is shown in FIG. 12B (d).

Then, the first developing step in step S25 is carried out. Step S25 may be carried out in the same manner as step S14 in the first embodiment. The structure of the wafer surface which has been subjected to step S25 is shown in FIG. 12B (e).

Then, the second developing step in step S26 is carried out. Step S26 may be carried out in the same manner as step S15 in the first embodiment. The structure of the wafer surface which has been subjected to step S26 is shown in FIG. 12B (f). Also, in the same manner as the first embodiment, the second developer used in step S26 may have a higher temperature or a higher concentration than the first developer.

Then, the storing step in step S27 is carried out. In step S27, substrates which have been subjected to the second developing step are temporarily stored in a buffer module until the top-coat coating step in step S23 is ended on all substrates (wafers) in a substrate group (lot) including a plurality of substrates (wafers).

Then, the acid coating step in step S28 is carried out. In step S28, acid is coated on resist pattern 33c by module M3 (top-coat coating module TC) as a reactive material for solubilizing resist pattern 33c. The structure of the wafer surface which has been subjected to step S28 is shown in FIG. 12C (g).

In step S28, a solution 35 containing acid as a reactive material for solubilizing resist pattern 33c is coated on resist pattern 33c. For example, TARC may be used as solution 35 containing acid in the same manner as the first embodiment. Specifically, a reactive material, such as, for example, solution 35 containing acid (H+) is coated on resist pattern 33c. Also, in step S28, after solution 35 containing acid serving as the reactive material is coated, the thermal process may be performed under a predetermined thermal process condition, so as to diffuse the acid serving as the reactive material within resist pattern 33c. Also, in the same manner as the first embodiment, the diffusion of the acid serving as the reactive material within resist pattern 33c may form a new soluble layer 33e on the surface of resist pattern 33c. Also, the upper limit temperature and the preferable temperature of the thermal process are the same as those in the first embodiment.

Then, the first slimming step in step S29 is carried out. Step S29 may be carried out in the same manner as step S18 in the first embodiment. The structure of the wafer surface which has been subjected to step S29 is shown in FIG. 12C (h).

According to the present embodiment, in the same manner as in the first embodiment, after the first developing step shown in FIG. 12B (e), a step for removing middle exposure area 33d (the second developing step) shown in FIG. 12B (f), a step for forming new soluble layer 33e (the acid coating step) shown in FIG. 12C (g), and a step for removing new soluble layer 33e (the third developing step) shown in FIG. 12C (h) are carried out. By removing middle exposure area 33d and new soluble layer 33e, it is possible to achieve a thinner line width CDfnl of resist pattern 33c, compared to the line width CDint achieved through the first developing step.

Hereinafter, the method for sequentially coating/developing a plurality of substrates by using the coating and developing apparatus according to the present embodiment will be described with reference to FIGS. 13 and 14.

Figure 13:
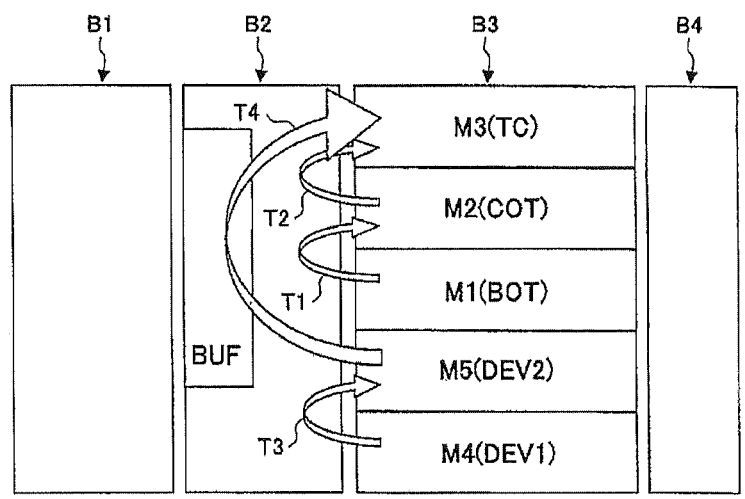
FIG. 13 is a schematic plan view schematically illustrating the configuration of a coating and developing apparatus according to a second exemplary embodiment.

FIG. 13 shows a schematic plan view schematically illustrating the configuration of the coating and developing apparatus according to the present embodiment. FIG. 14 shows a time chart illustrating the processing state of wafers in each module during the performance of the coating and developing method according to the present embodiment.

As shown in FIG. 13 (a simplified view of FIG. 10), in the coating and developing apparatus according to the present embodiment, in the order from bottom to top, module M4 (first developing module DEV1), module M5 (second developing module DEV2), module M1 (BARC coating module BOT), module M2 (resist coating module COT), and module M3 (top-coat coating module TC) are overlappingly disposed.

Also, as shown in FIG. 13, the coating and developing apparatus according to the present embodiment has a buffer module BUF for temporarily storing wafers in buffer block B2 provided between coating/developing block B3 and carrier block B1. Accordingly, the buffer module is provided in the neighborhood of the coating module.

Figure 14:
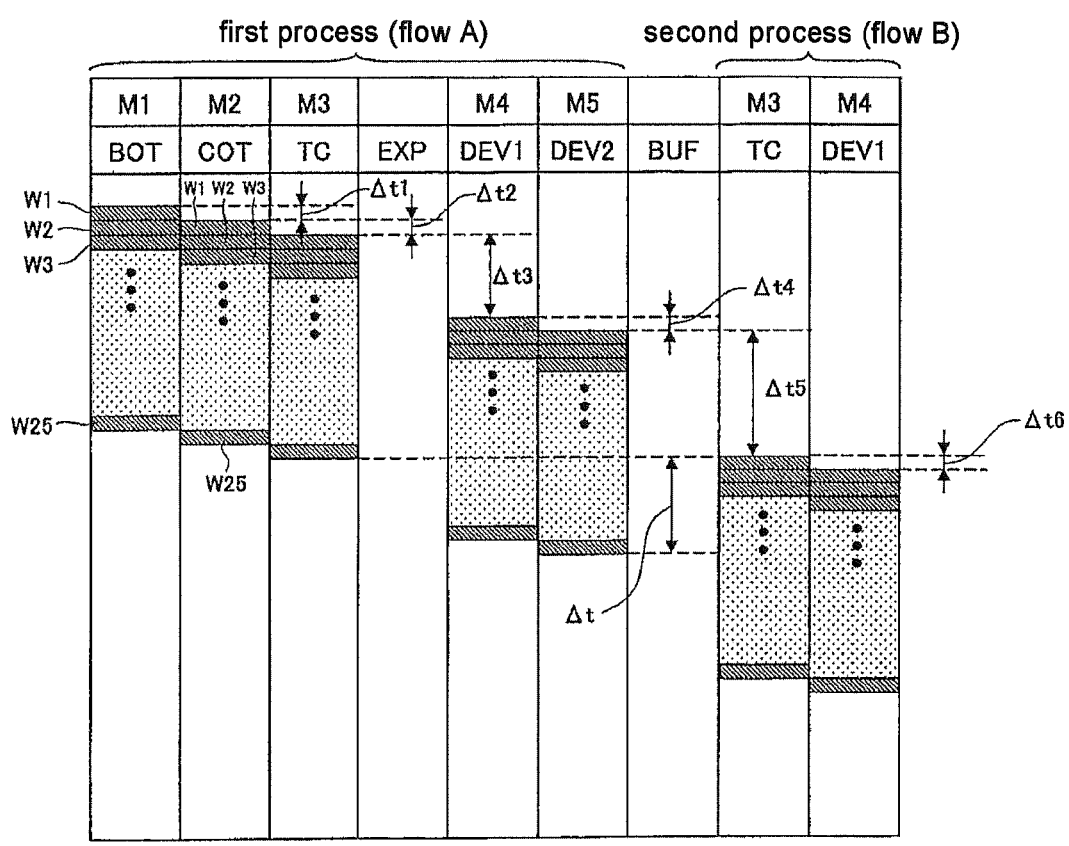
FIG. 14 is a time chart illustrating the processing state of wafers in each module during the performance of a coating and developing method according to a second exemplary embodiment.

As shown in FIGS. 13 and 14, in the present embodiment, a lot L1 including 25 wafers W1 to W25 is input, and the first process of the first-half (flow A) and the second process of the latter-half (flow B) are carried out.

In the first process of the first-half (flow A), respective wafers W in input lot L1 are sequentially carried to module M1 (BARC coating module BOT), and are sequentially coated with BARC. Respective wafers W which have been sequentially coated with BARC, are sequentially carried to module M2 (resist coating module COT) (carrying T1) in a direct way or via buffer module BUF, and are sequentially coated with a resist. Respective wafers W which have been coated with a resist, are sequentially carried to module M3 (top-coat coating module TC) (carrying T2) in a direct way or via buffer module BUF, and sequentially coated with a top-coat. Respective wafers W which have been coated with a top-coat, are exposed and then are sequentially carried to module M4 (first developing module DEV1) and sequentially subjected to the first developing process. Wafers W which have been subjected to the first developing process, are sequentially carried to module M5 (second developing module DEV2) (carrying T3) in a direct way or via buffer module BUF, and sequentially subjected to the second developing process.

After carrying out of the second developing process as described above, wafers which have been subjected to the first process (flow A) are temporarily stored in buffer module BUF until the second process (flow B) is started (carrying T4).

Meanwhile, in second process of the latter-half (flow B), respective wafers W stored in buffer module BUF are sequentially carried to module M3 (top-coat coating module TC) (carrying T4), and are sequentially coated with acid (acid coating). Wafers W which have been coated with acid are carried to module M4 (first developing module DEV1) in a direct way or via buffer module BUF, and subjected to the third developing process.

Hereinafter, the processing state of a plurality of wafers in a module during the performance of the coating and developing method according to the present embodiment will be described with reference to the time chart in FIG. 14.

In the present embodiment, when a lot including a plurality of wafers is input and the above described coating and developing method is performed on respective wafers of the input lot, the method is divided into the first process of the first-half (flow A) and the second process of the latter-half (flow B), as shown in FIG. 11.

Also, in the description below, the description on the heating and cooling processes which are appropriately carried out after the carrying out of the coating process in each coating module will be omitted.

In the coating and developing method according to the present embodiment, lot L1 including a plurality of (for example, 25) wafers W stored in a FOUP is input, respective wafers W (W1, W2, W3, . . . W25) of input lot L1 are sequentially subjected to the first process (flow A), and are stored in buffer module BUF. Also, processes in module M3 (top-coat coating module TC) commonly used in the first process (flow A) and the second process (flow B) are carried out as described below. In other words, right after the top-coat coating step (step S23) on last wafer W25 is ended in the first process (flow A), the acid coating step (step S28) on first wafer W1 is started in the second process (flow B).

First, the first process (flow A) is carried out. First of all, on 25 wafers W, in the order of W1, W2, W3, . . . W25, the BARC coating step is sequentially carried out by module M1 (BARC coating module BOT). Respective wafers W which have been coated with BARC, are sequentially carried to module M2 (resist coating module COT) (carrying T1) one by one by wafer carrying arm 2, and are sequentially subjected to the resist coating step in the order of W1, W2, W3, . . . W25. The point of time when the resist coating step is carried out in module M2 (resist coating module COT) is sequentially delayed by Δt1, which is the processing time of one wafer in module M1 (BARC coating module BOT).

Respective wafers W which have been subjected to the resist coating step in module M2 (resist coating module COT), are sequentially carried to module M3 (top-coat coating module TC) (carrying T2) one by one by wafer carrying arm 2, and are sequentially subjected to the top-coat coating step. The point of time when the top-coat coating step is carried out in module M3 (top-coat coating module TC) is sequentially delayed by Δt2, which is the processing time of one wafer in module M2 (resist coating module COT).

Then, in the same manner, respective wafers W (W1, W2, W3 . . . W25) are exposed in exposure device EXP, sequentially carried to module M4 (first developing module DEV1) and module MS (second developing module DEV2), and subjected to processes with respective sequential delays by Δt3, and Δt4. Then, after carrying out of the second developing step in module MS (second developing module DEV2), wafers W are sequentially stored in buffer module BUF (carrying T4).

Then, the second process of the latter-half (flow B) is carried out on wafers W stored in buffer module BUF. Herein, the acid coating step in module M3 (top-coat coating module TC) of the second process (flow B) is carried out with a sequential delay by Δt5. Also, the acid coating step on first wafer W1 may be started before the second developing step on last wafer W25 is ended as long as the top-coat coating step on last wafer W has been ended.

This is because buffer module BUF is provided near module M3 (top-coat coating module TC), and module M5 (second developing module DEV2), and wafer W can be directly transferred by one wafer carrying arm 2 between buffer module BUF, module M3, and module M5.

Respective wafers W which have been subjected to the acid coating step in module M3 (top-coat coating module TC), are carried to M4 (first developing module DEV1) one by one by wafer carrying arm 2, and are subjected to the third developing step. The point of time when the third developing step is carried out in module M4 (first developing module DEV1) is sequentially delayed by Δt6, which is the processing time of one wafer in module M3 (top-coat coating module TC). Then, respective wafers W (W1, W2, W3 . . . W25) are stored in the FOUP of carrier block B1.

Meanwhile, in a conventional coating and developing apparatus, there is no buffer module provided near a coating module. Hereinafter, the method for sequentially coating/developing a plurality of substrates by using the conventional coating and developing apparatus will be described with reference to FIGS. 15 and 16 through comparison.

Figure 15:
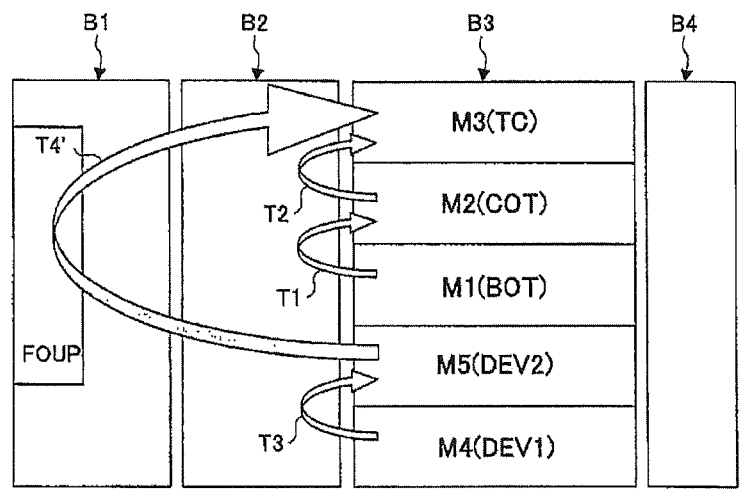
FIG. 15 is a schematic plan view schematically illustrating the configuration of a conventional coating and developing apparatus.
Figure 16:
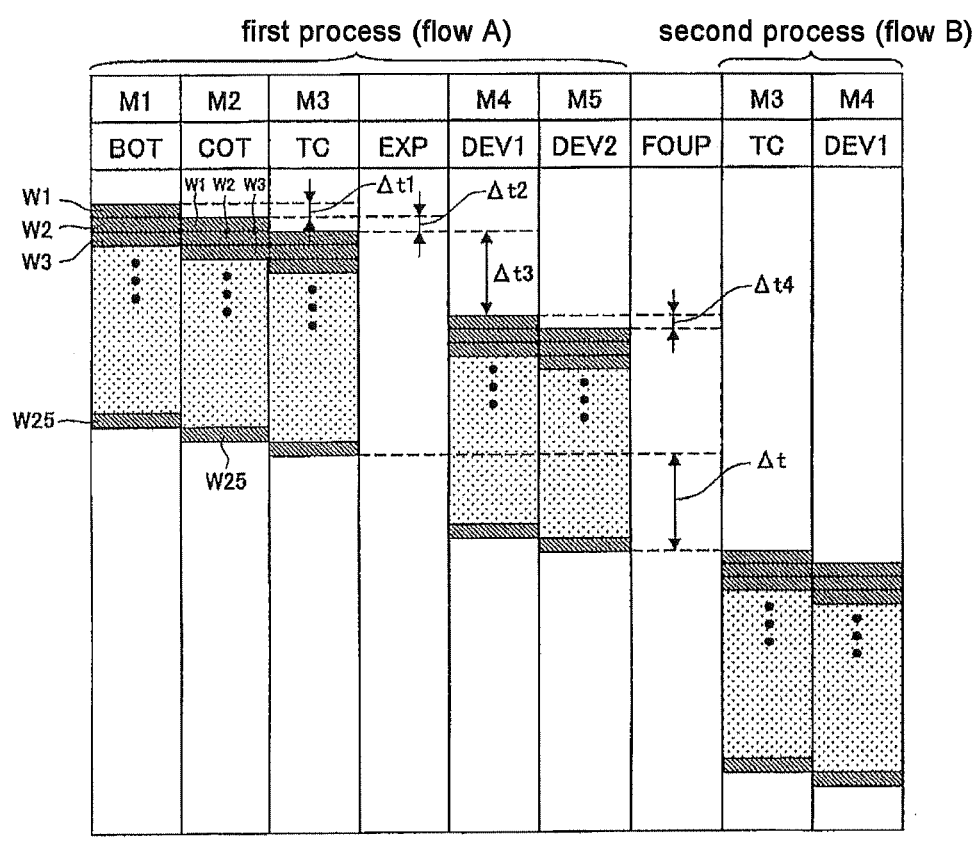
FIG. 16 is a time chart illustrating the processing state of wafers in each module during the performance of a conventional coating and developing method.

FIG. 15 shows a schematic plan view schematically illustrating the configuration of a conventional coating and developing apparatus. FIG. 16 shows a time chart illustrating the processing state of wafers in each module during the performance of a conventional coating and developing method.

As shown in FIG. 15, as a comparison example, in a developing system, in the order from bottom to top, module M4 (first developing module DEV1), module M5 (second developing module DEV2), module M1 (BARC coating module BOT), module M2 (resist coating module COT), and module M3 (top-coat coating module TC) are overlappingly disposed.

However, the coating and developing apparatus, as the comparison example, has no buffer module for temporarily storing wafers, in buffer block B2 provided between coating/developing block B3 and carrier block B1. Accordingly, in the coating and developing apparatus, as the comparison example, wafers which have been subjected to the first process are returned to and stored in a FOUP of carrier block B1.

Hereinafter, the processing state of a plurality of wafers in each module during the performing of the coating and developing method will be described as a comparison example with reference to the time chart in FIG. 16.

In the same manner as the present embodiment, in the comparison example, when the above described coating and developing method is performed on a plurality of wafers, the method is divided into a first process of a first-half and a second process of a latter-half.

Also, in the description of the comparison example, the description on heating and cooling processes which are appropriately carried out after the carrying out of the coating process in each coating module will be omitted.

First, in the same manner as the present embodiment, a plurality of (for example, 25) wafers W (W1, W2, W3, . . . W25) stored in a FOUP are sequentially subjected to the first process (flow A). Also, in the same manner as the present embodiment, modules M2 to M5 are sequentially delayed, respectively, compared to modules M1 to M4, by Δt1 to Δt4. However, in the comparison example, after carrying out of the second developing step in module M5 (second developing module DEV2), respective wafers W (W1, W2, W3 . . . W25) are returned to the FOUP, and are sequentially stored (carrying T4').

Then, on wafers W (W1, W2, W3 . . . W25) stored in the FOUP, the second process of the latter-half (flow B) is carried out. However, in the comparison example, the acid coating step cannot be started by carrying wafers from the FOUP to module M3 (top-coat coating TC) (carrying T4'), after the second developing step on last wafer W25 is ended. Since there is no buffer module for stand-by of module processes through repetitive supplies, it is required to return respective wafers W to the FOUP.

Accordingly, in the comparison example, the point of time when the second process (flow B) is started, is delayed by Δt as shown in FIG. 16, compared to the point of time when the second process (flow B) can be started in the present embodiment. In other words, in the present embodiment with a buffer module BUF, a total access time (TAT) for processing all wafers W (W1, W2, W3 . . . W25) of lot L1 is shortened by Δt, compared to the comparison example with no buffer module BUF.

According to the present embodiment, in the same manner as the first embodiment, a buffer module is provided near a coating unit and developing unit, which are overlappingly disposed on top of each other. Herein, a wafer which has been subjected to the first-half first process is temporarily stored in the buffer module provided near a module in which the second process of the latter-half is started. Accordingly, at the start of second process of the latter-half, before the first-half first process is completely performed on all substrates, the second process of the latter-half may be precedently performed on a part of the plurality of substrates. Also, since there is no need to return wafers to the FOUP at the time point of completion of a lot or completion of each process step, it is possible to minimize a wafer processing route. Accordingly, it is possible to shorten the total access time (TAT).

Although the preferred embodiment of the present disclosure is described, the present disclosure is not limited thereto, but may be variously changed or modified within the scope of the present disclosure defined in claims.

Also, the present disclosure may be applied not only to the coating and developing apparatus, but also to a substrate cleaning apparatus, a film forming apparatus, an etching apparatus, or various other apparatuses. Also, the present disclosure may be applied to any apparatus including a process for carrying a semiconductor substrate, a glass substrate, or various other substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A coating and developing apparatus comprising:
a carrier block including a cassette placing unit configured to dispose a cassette accommodating substrates of a substrate group,
a buffer block adjoining the carrier block on a side and including a buffer module;
a processing block adjoining the buffer block on a side and including at least a first liquid process module and a second liquid process module each configured to process the substrates with a predetermined sequence;
an interface block adjoining the processing block on a side that does not adjoin the buffer block; and
a control unit configured to control the first liquid process module, the second liquid process module, and the buffer module, thereby performing at least a first liquid process, a second liquid process and a third liquid process,
wherein the control unit controls the first liquid process module to sequentially perform the first liquid process using a first chemical liquid on each of the substrates of a substrate group, and to sequentially perform the third liquid process again using the first chemical liquid on each of the substrates which has been subjected to the first liquid process,
the control unit controls the buffer module to temporarily store each of the substrates sequentially which has been subjected to the first liquid process but has not yet been subjected to the third liquid process,
the control unit controls the second liquid process module to sequentially perform the second liquid process using a second chemical liquid on each of the substrates which has been taken out from the buffer module but has not yet been subjected to the third liquid process,
the control unit controls the first liquid process module, the second liquid process module and the buffer module such that the second liquid process to be performed on a first substrate of the substrate group is started before the first liquid process performed on a last substrate of the substrate group is ended so that the third liquid process is performed on the first substrate of the substrate group right after the first liquid process is performed on the last substrate of the substrate group, and
each of the substrates loaded to the cassette is sequentially transferred to a process module of the processing block where a coating film including a resist film is formed, carried to an exposure device via the interface block, and then each of the substrates which has been exposed and returned via the interface block is developed in the process module, and then transferred to the carrier block thereby sequentially performing a liquid process on each of the substrates of the substrate group.

2. The coating and developing apparatus as claimed in claim 1, wherein the buffer module is designed in such a manner that each of the substrates is transferred by a single substrate carrying arm, between the buffer module and the first liquid process module.

3. The coating and developing apparatus as claimed in claim 2, further comprising a third liquid process module to sequentially perform a fourth liquid process by a third chemical liquid on each of the substrates which has been subjected to the third liquid process but has not yet been subjected to the second liquid process.

4. The coating and developing apparatus as claimed in claim 3, wherein the first liquid process module is a first developing module, the second liquid process module is a second developing module, the third liquid process module is a coating module, the first chemical liquid is a first developer, the second chemical liquid is a second developer which has a higher temperature or a higher concentration, than the first developer, and the third chemical liquid is acid to solubilize resist.

5. The coating and developing apparatus as claimed in claim 1, further comprising a third liquid process module to sequentially perform a fourth liquid process by a third chemical liquid on each of the substrates which has been subjected to the third liquid process but has not yet been subjected to the second liquid process.

6. The coating and developing apparatus as claimed in claim 5, wherein the first liquid process module is a first developing module, the second liquid process module is a second developing module, the third liquid process module is a coating module, the first chemical liquid is a first developer, the second chemical liquid is a second developer which has a higher temperature or a higher concentration, than the first developer, and the third chemical liquid is acid to solubilize resist.

7. A coating and developing apparatus comprising:
a carrier block including a cassette placing unit configured to dispose a cassette accommodating substrates of a substrate group;
a buffer block adjoining the carrier block on a side and including a buffer module;
a processing block adjoining the buffer block on a side and including at least a first liquid process module and a second liquid process module each configured to process the substrates with a predetermined sequence;
an interface block adjoining the processing block on a side that does not adjoin the buffer block; and
a control unit configured to control the first liquid process module, the second liquid process module, and the buffer module, thereby performing at least a first liquid process, a second liquid process and a third liquid process,
wherein the control unit controls the first liquid process module to sequentially perform the first liquid process using a first chemical liquid on each of the substrates of the substrate group, and to sequentially perform the third liquid process again using a second chemical liquid on each of the substrates which has been subjected to the first liquid process,
the control unit controls the second liquid process module to sequentially perform the second liquid process using a third chemical liquid on each of the substrates which has been subjected to the first liquid process,
the control unit controls the buffer module to temporarily store each of the substrates sequentially which has been subjected to the first and second liquid processes but has not yet been subjected to the third liquid process, until the first liquid process performed on a last substrate of the substrate group is ended, and
each of the substrates loaded to the cassette is sequentially transferred to a process module of the processing block where a coating film including a resist film is formed, carried to an exposure device via the interface block, and then each of the substrates which has been exposed and returned via the interface block is developed in the process module, and then transferred to the carrier block thereby sequentially performing a liquid process on each of the substrates of the substrate group.

8. A coating and developing method comprising:
providing a coating and developing apparatus including a carrier block equipped with a cassette placing unit for a cassette, a buffer block adjoining the carrier block on a side equipped with a buffer module, a processing block adjoining the buffer block on a side equipped with at least a first liquid process module and a second liquid process module, and an interface block adjoining the processing block on a side;
performing a first liquid process by a first liquid process module on a substrate of a substrate group having a plurality of substrates using a first chemical liquid;
temporarily storing the substrate which has been subjected to the first liquid process in a buffer module;
performing a second liquid process by a second liquid process module on the substrate taken out from the buffer module after the storing step using a second chemical liquid; and
performing a third liquid process using the first liquid process module again on the substrate which has been subjected to the second liquid process using the first chemical liquid,
wherein the second liquid process to be performed on a first substrate of the substrate group is started before the first liquid process performed on a last substrate of the substrate group is ended so that the third liquid process is performed on the first substrate of the substrate group right after the first liquid process is performed on the last substrate of the substrate group, and
wherein each of the substrates loaded to the carrier block by a cassette is sequentially transferred to a process module of the processing block where a coating film including a resist film is formed, carried to an exposure device via the interface block, and then each of the substrates which has been exposed and returned via the interface block is developed in the process module, and then transferred to the carrier block thereby sequentially performing a liquid process on each of the substrates of the substrate group.

9. The coating and developing method as claimed in claim 8, wherein the buffer module allows the substrate to be transferred by a single substrate carrying arm, between the buffer module and the first liquid process module.

10. The coating and developing method as claimed in claim 9, further performing a fourth liquid process by a third liquid process module on the substrate which has been subjected to the second liquid process but has not yet been subjected to the third liquid process using a third chemical liquid.

11. The coating and developing method as claimed in claim 10, wherein the first liquid process module is a first developing module, the second liquid process module is a second developing module, the third liquid process module is a coating module, the first chemical liquid is a first developer, the second chemical liquid is a second developer which has a higher temperature or a higher concentration, than the first developer, and the third chemical liquid is acid to solubilize resist.

12. The coating and developing method as claimed in claim 8, further performing a fourth liquid process by a third liquid process module on the substrate which has been subjected to the second liquid process but has not yet been subjected to the third liquid process using a third chemical liquid.

13. The coating and developing method as claimed in claim 12, wherein the first liquid process module is a first developing module, the second liquid process module is a second developing module, the third liquid process module is a coating module, the first chemical liquid is a first developer, the second chemical liquid is a second developer which has a higher temperature or a higher concentration, than the first developer, and the third chemical liquid is acid to solubilize resist.

14. A coating and developing method comprising:
providing a coating and developing apparatus including a carrier block equipped with a cassette placing unit for a cassette, a buffer block adjoining the carrier block on a side equipped with a buffer module, a processing block adjoining the buffer block on a side equipped with at least a first liquid process module and a second liquid process module, and an interface block joining the processing block on a side;
performing a first liquid process by a first liquid process module on a substrate of the substrate group using a first chemical liquid;
performing a second liquid process by a second liquid process module on the substrate which has been subjected to the first liquid process using a second chemical liquid;
temporarily storing the substrate which has been subjected to the first and second liquid processes in a buffer module, until the first liquid process performed on a last substrate of the substrate group is ended; and performing a third liquid process by the first liquid process module again on the substrate taken out from the buffer module using a third chemical liquid, wherein each of the substrates loaded to the carrier block by a cassette is sequentially transferred to a process module of the processing block where a coating film including a resist film is formed, carried to an exposure device via the interface block, and then each of the substrates which has been exposed and returned via the interface block is developed in the process module, and then transferred to the carrier block thereby sequentially performing a liquid process on each of the substrates of the substrate group.

* * * * *